(12) United States Patent
Corson et al.

(10) Patent No.: US 6,629,292 B1
(45) Date of Patent: Sep. 30, 2003

(54) METHOD FOR FORMING GRAPHICAL IMAGES IN SEMICONDUCTOR DEVICES

(75) Inventors: Phillip L. Corson, Westford, VT (US); Gary R. Holsopple, Fairfax, VT (US); Jason M. Parry, Winooski, VT (US); William F. Pokorny, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 299 days.

(21) Appl. No.: 09/680,879

(22) Filed: Oct. 6, 2000

(51) Int. Cl.$^7$ .......................... G06F 17/50; G09G 3/36; G09G 5/00; G03B 27/02; G03B 27/10; G03B 27/27; G03B 27/32; G03B 27/44; G03B 27/52; G03B 27/68; G03B 27/72

(52) U.S. Cl. .......................... 716/3; 345/90; 345/206; 345/668; 355/7; 355/40; 355/46; 355/52; 355/54; 355/71; 355/77; 355/84; 355/132; 355/133

(58) Field of Search .................. 716/3; 355/7, 132, 355/133, 52, 77, 71, 84, 40, 46, 54; 345/668

(56) References Cited

U.S. PATENT DOCUMENTS

| | | | |
|---|---|---|---|
| 1,586,927 A | 6/1926 | Wilkinson et al. ............ 228/185 |
| 1,811,734 A | 6/1931 | Trist ............................. 101/458 |
| 2,083,249 A | 6/1937 | Thomson ........................ 430/11 |
| 2,291,854 A | 8/1942 | Whyzmuzis ................... 41/41.5 |
| 2,767,093 A | 10/1956 | Bilhoefer ......................... 95/81 |
| 2,952,080 A | 9/1960 | Avakian et al. ................... 35/2 |
| 2,984,030 A | 5/1961 | Hannon .......................... 40/2.2 |
| 3,503,815 A | 3/1970 | Johnson .......................... 156/6 |
| 3,610,120 A | 10/1971 | Morse et al. ................... 95/1.1 |
| 3,807,852 A | 4/1974 | Hoydic ............................ 355/7 |
| 3,982,949 A | 9/1976 | Reymond ....................... 96/116 |
| 4,122,496 A | 10/1978 | Childress et al. ............ 358/298 |
| 4,343,877 A | 8/1982 | Chiang ............................. 430/5 |
| 4,343,878 A | 8/1982 | Chiang ............................. 430/5 |
| 4,360,548 A | 11/1982 | Skees et al. ................... 428/29 |
| 4,442,188 A | 4/1984 | Chiang ............................. 430/5 |

(List continued on next page.)

FOREIGN PATENT DOCUMENTS

WO  WO 89/08322  9/1989  .......... H01J/37/305

OTHER PUBLICATIONS

"HD-ROSETTA Archival Preservatuib Services", http:/www.norsam.com/rosetta.html, Jun. 22, 2000.

"Los Alkamos National Labs Tests the HD-ROSETTA Disc", http://www.norsam.com/discreport.html, Jan. 31, 1999.

Primary Examiner—Matthew Smith
Assistant Examiner—Andrea Liu
(74) Attorney, Agent, or Firm—Mark Chadurjian; Anthony J. Canale

(57) ABSTRACT

High resolution gray scale graphical images are formed in a semiconductor substrate by the use of two or more levels of indicia having a plurality of image segments and having a continuous conductive line formed in the surface of the substrate, each image segment includes a portion of said continuous conductive line and a contrasting material providing pixels in which the width of the line within a segment varies in relationship to gray scale levels in the graphic image to be formed. Providing a graphic image to be converted; converting the graphic image to a gray level, two dimensional bit mapped converting the bit mapped image into a set of parallel lines of varying width; each line comprising a single continuous segment in which the width varies based on the density of the gray level required to form the gray level image; and transferring the set of lines to a pattern of conductor/insulator lines on a substrate.

25 Claims, 25 Drawing Sheets

U.S. PATENT DOCUMENTS

| | | | |
|---|---|---|---|
| 4,459,020 A | 7/1984 | May et al. .................... | 355/132 |
| 4,504,083 A | 3/1985 | Devrient et al. ............... | 283/77 |
| 4,557,596 A | 12/1985 | Muller et al. ................ | 355/132 |
| 4,606,633 A | 8/1986 | Jeschke et al. .............. | 356/237 |
| 4,659,113 A | 4/1987 | Muller et al. .................. | 283/94 |
| 4,698,627 A * | 10/1987 | den Boer et al. ............ | 345/206 |
| 4,808,983 A * | 2/1989 | Benjamin et al. .............. | 345/90 |
| 4,900,111 A | 2/1990 | D'Amato et al. ........... | 350/3.85 |
| 4,910,603 A | 3/1990 | Hirahara et al. ............. | 358/298 |
| 5,016,191 A | 5/1991 | Radochonski ............... | 364/518 |
| 5,204,729 A | 4/1993 | Maeda et al. ............... | 355/326 |
| 5,334,467 A | 8/1994 | Cronin et al. .................. | 430/5 |
| 5,402,410 A | 3/1995 | Yoshimura et al. ....... | 369/275.1 |
| 5,480,764 A | 1/1996 | Gal et al. .................... | 430/321 |
| 5,555,103 A | 9/1996 | Anderson ................... | 358/456 |
| 5,567,573 A | 10/1996 | Morton ........................ | 430/321 |
| 5,581,294 A | 12/1996 | Fujii et al. .................. | 347/183 |
| 5,609,967 A | 3/1997 | Matsunami .................. | 428/601 |
| 5,664,497 A | 9/1997 | Zuniga et al. .............. | 101/487 |
| 5,721,687 A | 2/1998 | Lamartine et al. ..... | 364/474.08 |
| 5,739,842 A | 4/1998 | Murata ........................ | 347/252 |
| 5,773,116 A | 6/1998 | Lamartine et al. .......... | 428/64.1 |
| 5,784,091 A | 7/1998 | Ema et al. .................. | 347/131 |
| 5,946,453 A | 8/1999 | Broddin et al. .............. | 395/109 |
| 5,982,508 A | 11/1999 | Kashihara ................... | 358/456 |
| 5,998,066 A | 12/1999 | Block et al. .................... | 430/5 |

\* cited by examiner

FIG. 8
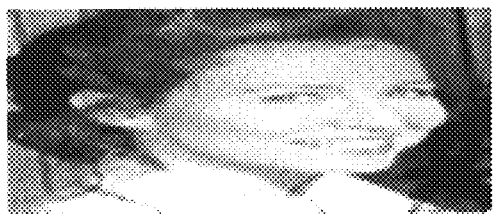
FIG. 9
| 3 | 8 | 6 | 2 |
|---|---|---|---|
| 13 | 0 | 5 | 4 |
| 6 | 2 | 9 | 12 |
| 10 | 15 | 1 | 14 |
FIG. 10
| | | | | | |
|---|---|---|---|---|---|
| Top | 3 | 8 | 6 | 2 | — Frame |
| Bottom | 13 | 0 | 5 | 4 | |
| | | | | | |
|---|---|---|---|---|---|
| Top | 6 | 2 | 9 | 12 | — Frame |
| Bottom | 10 | 15 | 1 | 14 | |
FIG. 11
| T3 | T8 | T6 | T2 |
|---|---|---|---|
| B13 | B0 | B5 | B4 |
| T6 | T2 | T9 | T12 |
|---|---|---|---|
| B10 | B15 | B1 | B14 |
FIG. 12A
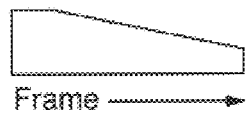
FIG. 12B
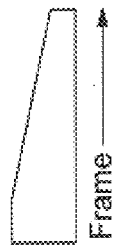

After exposure

Resist    Adjustment

After bias

Wire    Frame

After exposure

Resist    Overlap

After bias

Layer 1    Layer 2

Original

With OPC shapes

FIG. 27
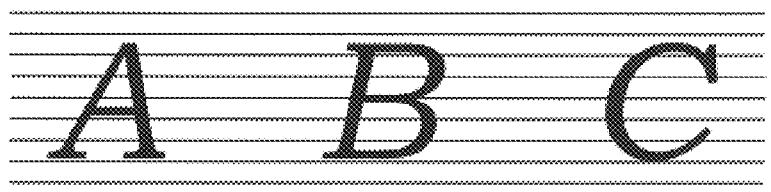
FIG. 28
FIG. 29
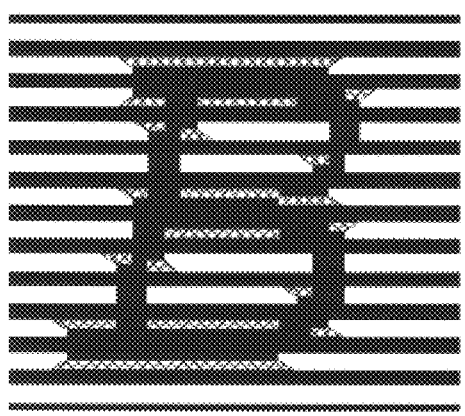
FIG. 30
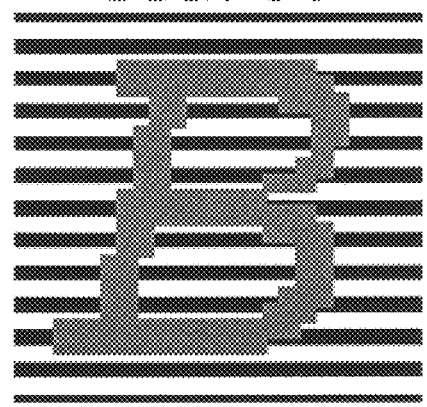
FIG. 31
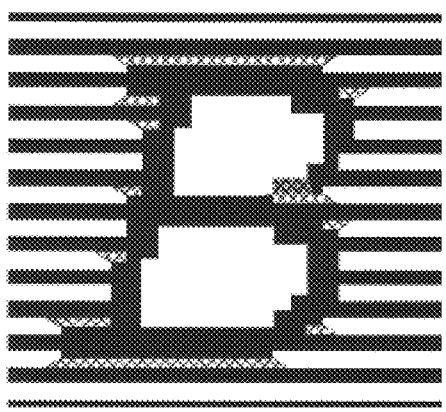
FIG. 32
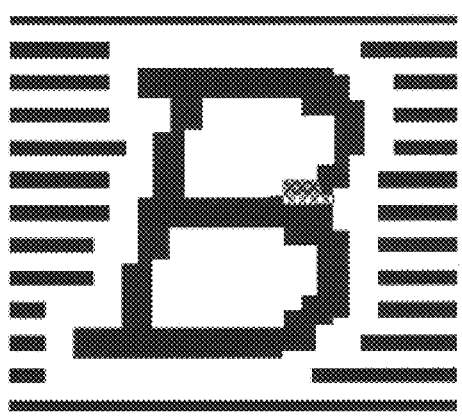

| 1 | 1 | 1 | 1 | 1 | 1 |
|---|---|---|---|---|---|
| 1 | 0 | 0 | 0 | 0 | 0 |
| 1 | 1 | 1 | 0 | 1 | 1 |
| 0 | 0 | 0 | 0 | 1 | 1 |
| 1 | 1 | 1 | 0 | 1 | 1 |
| 0 | 0 | 0 | 0 | 0 | 0 |
| 0 | 0 | 0 | 0 | 0 | 0 |
| 0 | 0 | 0 | 0 | 0 | 0 |

FIG. 43A

| P1 11101 L = 17 | P2 11000 L = 16 | P3 11001 L = 17 |
|---|---|---|
| P4 11001 L = 17 | P5 10001 L = 29 | P6 11111 L = 31 |
| P7 00000 L = 0 | P8 00000 L = 0 | P9 00000 L = 0 |

FIG. 43B

| DOC Number | Location (dx, dy) | Pointer |
|---|---|---|
| 00000001 | 35000, 35000 | ↘ |
| 00000002 | 0. -10000 | ↓ |
| 00000003 | -10000, -10000 | ↙ |
| 00000004 | -7500, -10000 | ↙ |

| DOC Number | Location | |
|---|---|---|
| 00000001 | 35000, 35000 | X |

| DOC Number | Location (dx, dy) | Pointer |
|---|---|---|
| 00000002 | 0. -10000 | ↓ |
| 00000003 | -10000, -10000 | ↙ |
| 00000004 | 7500, -10000 | ↙ |

0.342

0.359

0.333

METHOD FOR FORMING GRAPHICAL IMAGES IN SEMICONDUCTOR DEVICES

BACKGROUND OF THE INVENTION

1. Field of the Invention

This invention relates to methods of forming graphical images which are intended to be eventually perceptible to the human eye with or without the aid of imaging enhancement means and more particularly to methods of forming images in semiconductor devices which are easy to fabricate and provide a good likeness of the image being portrayed.

2. Description of Related Art

Techniques for forming graphical images on the surface of semiconductor devices have been used as long as semiconductor devices have been fabricated. As part of the camaraderie among circuit designers, most have found ways to leave "their mark" on the surface of semiconductor devices, usually in one or more of the layers of the material having sufficient contrast to be clearly visible on a completed device. Such "art work" usually depicts some form of logo representing a company or designer's code name for the product. For example, the logo for a product called "Eagle" might include a crude image of an eagle formed within the limits of the specific processing technology from which the device is manufactured.

For the most part, such images have been either relatively crude and/or are subject to "ground rule" violations established by the process designers. Creating images in semiconductor devices is accomplished by making patterns in existing metallurgy in which the metal and it's contrasting adjacent insulators are shaped, similar to creating images in a stencil or in creating designs for carving pumpkins. That is, since the pattern is formed by the opaque (or clear) segments of a mask in a binary fashion all of the opaque portions of a design must remain attached to each other, otherwise some of the pieces of patterned metallurgy will be lost by falling off of the supporting substrate and causing contamination or reliability problems with the devices.

Because of the difficulty in creating images in the metallurgy of semiconductor devices, resulting images heretofore have been of the simplest binary design.

SUMMARY OF THE INVENTION

It is an object of the present invention to provide a capability for forming gray level images in the surface of semiconductor devices by taking advantage of certain features of the recently implemented practice of interconnect metallurgy in which high degree of planarization between metal layers and corresponding interlevel metal dielectric layers is characteristic.

It is another object of this invention to provide an efficient method for converting any image into a two dimensional pattern of contrasting materials which in turn is capable of rendering a visually perceptible image with a high degree of resolution and detail.

It is a further object of this invention to provide a new and useful media for storing and recovering gray level black and white as well as color images which has a long lifetime and is considerably space conserving.

These and other object of the invention will become apparent to those skilled in the art when considered in view of the following more detailed description and the accompanying drawings.

BRIEF DESCRIPTION OF THE DRAWINGS

FIG. 2a is a representation of a group of four pixels as depicted in FIG. 2a, showing various levels of data.

FIG. 3b is a representation of a composite of eight pixels as shown in FIG. 3a.

FIG. 8 demonstrates the effect of logically expanding the graphic of FIG. 6 in the horizontal direction as viewed.

FIG. 9 represents a matrix of 16 contiguous pixels, each having its own binary weight of 1 to 16.

FIG. 10 illustrates how the matrix of pixels from the compressed image is physically in the two pixel pair of FIG. 3.

FIG. 11 represents a logical representation of the actual layout of a wire frame structure of the invention.

FIG. 12a shows a figure in which a horizontal orientation is preferred.

FIG. 12b shows a figure in which a vertical orientation is preferred.

FIG. 14 illustrates the actual appearance on a frame wire of the figure of FIG. 12a.

FIGS. 27 through 38 illustrate various stages of data refinement used in one embodiment of the invention to create visually perceptible images.

FIG. 42a shows a physical representation of an image including 3×3 pixels formed using the frame wire technique.

FIG. 42b shows a logical representation of the image in FIG. 42a.

FIG. 43a illustrate the notation used to identify the 3×3 matric of FIG. 42.

FIG. 43b is a representation of the actual physical representation of the image matrix shown in FIGS. 42 and 43a.

DESCRIPTION OF THE PREFERRED EMBODIMENT

Figure 1A:
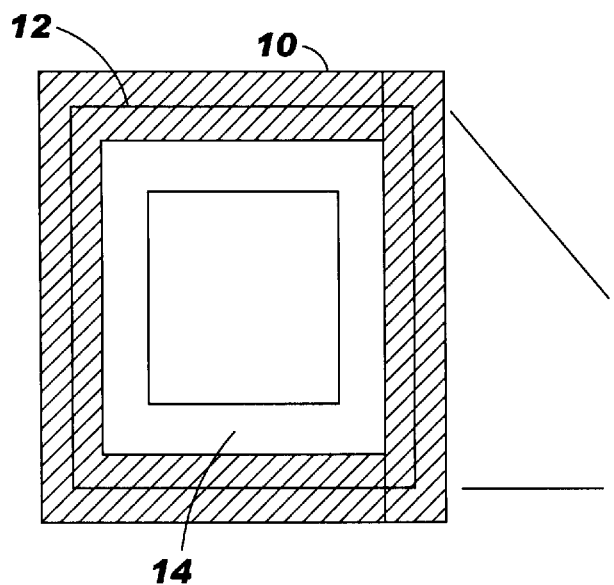
FIG. 1a is a representation of a pixel for graphical display in which a gray scale is represented by a square closing on four sides simultaneously.

Gray scale images can be formed with structures and techniques inherently used in the fabrication of integrated semiconductor devices. For example, images can be formed using assorted techniques to vary the amount of material in a particular location thereby locally changing the amount of light reflected in much the same way images are traditionally printed on paper or other media except that here, instead of ink and paper, the materials commonly used to make wires on a semiconductor device are used.

In forming images on semiconductor devices, some of the same printing techniques which are common in ink on paper-based printing methods can be used. Namely, techniques involving the density of various shapes or dots and those that vary the size of shapes or dots in a manner similar to half tone printing methods can be used. But these methods have limitations in typical semiconductor processes in that there are limits on the smallest feature or dot which can be produced because of limits in the photo lithography and the minimum features which can be supported in the photoresist.

In planarization processes where the materials are subjected to a polish step there are upper bounds on the size of the shapes which can be used and usually local density restraints as well. All of these constraints limit the quality and size of gray scale images which can be implemented by typical semiconductor processes.

In the dual Damascene metallization technology currently practiced, the metal, currently copper, is deposited into trenches and via holes etched in an interlevel dielectric layer. Several reasons dictate that the copper be formed such that it overfills the trenches and is therefore required to be planarized to render the top surface of the metal and dielectric co-planar. Because of irregularities in the polishing process, ground rules have been established requiring, for example, maximum distances between conductive lines and within conductive lines. The subject invention inherently enables all of such ground rules to be met.

Herein, we disclose a method for forming gray scale images in a semiconductor process which utilizes the concept of a continuous frame wire connecting dots of various size each having corresponding gray scale reflectivity. The use of the frame wire allows the creation of images without violating the process ground rules for the typical process constraints outlined above.

The field into which each image can be said to exist is divided into a number of regularly shaped picture elements (pixels). Each pixel can be thought of as an area of reflectivity. Changes in the area of metal—preferably a shiny reflective metal such as aluminum polished to act as a mirror—can be made in extremely small increments (delta) off the frame. Each pixel attached to the frame wire can be constructed in various manners and abutted together to form a complex image. Although we are talking in terms of frame and delta, on the wafer we have one level which is the composite of the frame and delta.

Figure 1B:
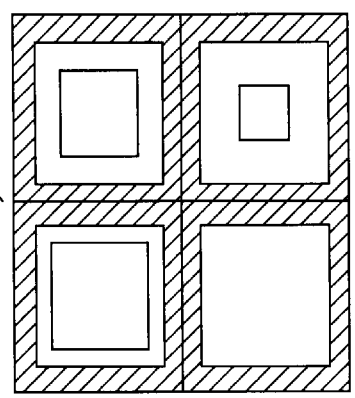
FIG. 1b is a representation of a group of four pixels as depicted in FIG. 1a, showing various levels of data.

The following pixel design schemes are examples which are compatible with typical semiconductor manufacturing processes:

1. FIG. 1a illustrates a single pixel element an aperture which closes from four sides where the size of the sides can be altered either together or independently. A frame 10 is used in each pixel within the pixel frame 12. Gray levels are depicted by region 14 which fills the frame with intensity information. FIG. 1b illustrates a contiguous group of four pixels, each being of a different gray level.

Figure 2A:
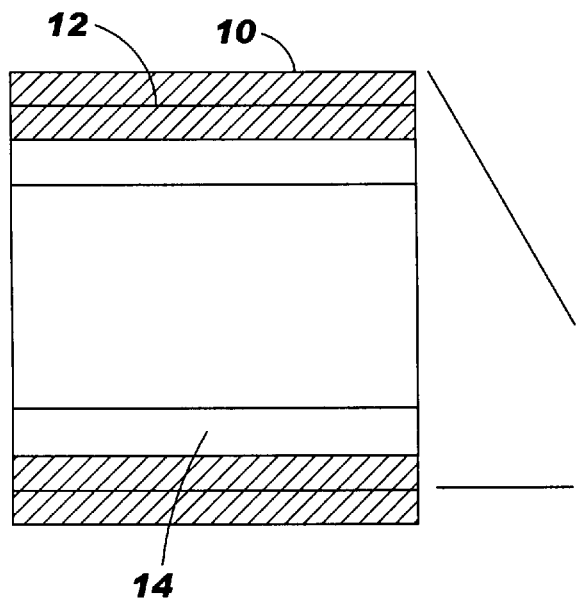
FIG. 2a is a representation of a pixel for graphical display in which a gray scale is represented by a square closing on two sides simultaneously
Figure 2B:
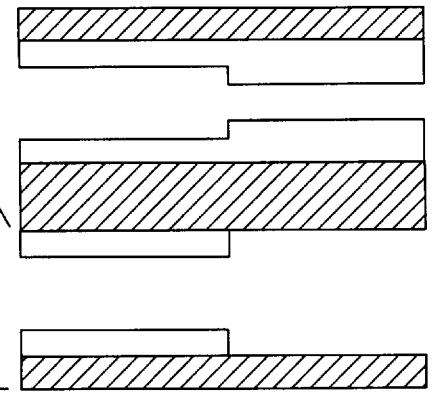

2. FIGS. 2a and 2b illustrate a two-sided pixel which closes from two opposite sides where the sides can be controlled together or independently.

Figure 3A:
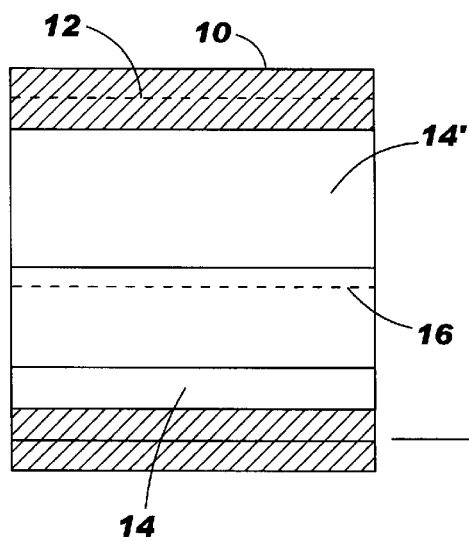
FIG. 3a is a representation of a pair of pixels, each having only a single variable edge.
Figure 3B:
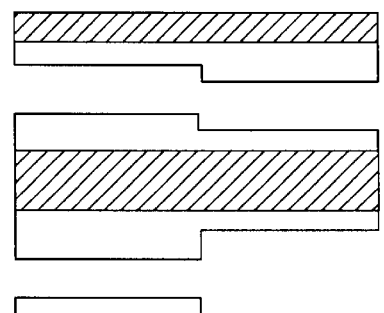

3. FIG. 3a illustrates our preferred method which represents a pair of one sided pixels which is controlled by moving or modifying the one free edge 14 and 14". Pixels are provided in pairs as a set of upper pixel and lower pixels separated by a 'minimum space' 16. This method affords good resolution and is the method preferred for standard semiconductor processes where logos and such are to be implemented. FIG. 3b represents a block of eight pixels.

Note in all these examples, each pixel occupies one-half of the minimum frame or line width and one-half of the minimum space between lines when there are two pixels of maximum intensity. In other words, because the embodiment is implemented in contrasting materials such as conductive lines and insulating materials, the lowest intensity image is formed when the conductive lines are of a minimum width and the highest image intensity is achieved when the lines are of maximum width and the insulating material is of minimum width. Since all of the pixels are preferred to be of the same size a half-tone-like image can be created.

Various options which permit the space and frame wire to drift or merge within an image are possible as described below.

All of the images are composed of a large number of pixels. In the last method above, 16 levels of gray are defined. It is preferred to provide pixels such that there a pair of pixels a set of 16 pixel cells for the bottom portion of each frame wire and another set of 16 for the top of the frame wire. Because of the capabilities of typical semiconductor processing available, each pixel cell will be constructed to contain any of the levels comprising the image. In one of the simpler implementations we simply copy the metal representing the image onto all the metal layers being processed. The image is composed of the reflective metal view and a gap or background of unreflective material. The gap or dark portion of each pixel is usually filled with polysilicon or other material which will reflect less light than would the semiconductor substrate.

Figure 4A:
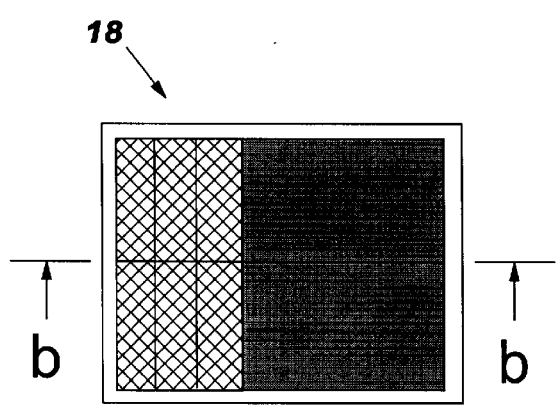
FIG. 4a is a representation of the plan view of a single pixel formed on a semiconductor substrate using the techniques of the invention.
Figure 4B:
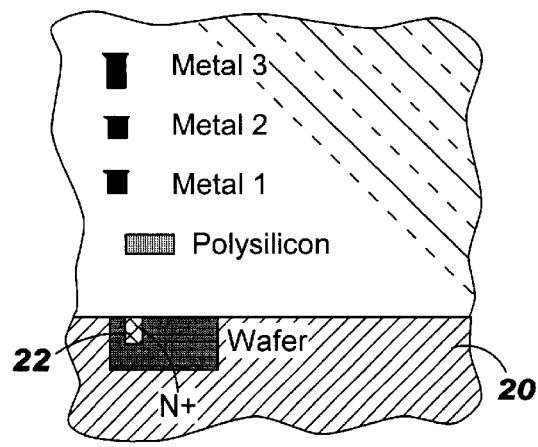
FIG. 4b is a representation of a cross-sectional view of FIG. 4a taken along the line b—b.

A plan view of a single pixel 18 depicting an intermediate gray level cell is shown in FIG. 4a. A cross-sectional view of the same pixel taken along the line b—b of FIG. 4a is illustrated in FIG. 4b and shows a semiconductor substrate 20, $N^+$ diffusion region 22, a polysilicon layer and three levels of metal M1, M2 and M3, each one of which is formed from structures found in the technology used to fabricate a typical semiconductor device.

The pixels of FIG. 4 can be constructed through the use of any number of interactive editing tools, or by other programs, and stored in the manner commonly used to create and store other data from which masks are built for semiconductor processes.

The polysilicon is used here to provide added contrast. The $N^+$ diffusion is added in technologies where there are local density requirements for placement and may or may not play a role in forming the images of the instant invention. The metal layers placed below that of the top metal M3 are added both for local density and to help diffuse diffracted light helping to form the visible image, as described in more detail below.

Figure 5:
FIG. 5 is an example of a graphic image formed using four levels of density using the technique of the invention.

It is also possible to build pixels which contain composites of various levels. The same shape of metal segment will appear darker at the level of metal M1 than one formed at the level of metal M3 so it is, for example, possible to bucket pixels such that the darkest third use only M1, the middle third use M1 and M2, and the brightest third use M1, M2 and M3. An example of a four-level image is illustrated in FIG. 5.

While it is preferable to use multiple levels of metal or contrasting material to form a composite image, it is possible to utilize only a single level.

The basic process necessary to create an image on a semiconductor device begins with an image and, if not already in a digital representation, it can be scanned with a scanner or photographed with a digital camera.

The image format of the digital image can be any of a number of standard digital graphical formats such as jpg (A Joint Photographic Experts Group standard file format for still image data compression), gif (Graphical Interchange Format, a standard for digitized images compressed with the LZW algorithm, defined in 1987 by CompuServe (CIS)). Or other standard graphical data compression format which are supported by most of today's software programs. Using one of these programs, gimp, or the GNU Image Manipulation Program, a capable and advanced image editor available for free for use with the Linux Operating system, whatever digital image manipulation is desired is completed before encoding it for the semiconductor device. These manipulations usually involve scaling to a particular size image—this scale is often asymmetric to match the asymmetric character of the frame-based image technique where one obtains a density of two and sometimes three pixels along the frame wire than we can obtain in the direction perpendicular to it.

Figure 6:
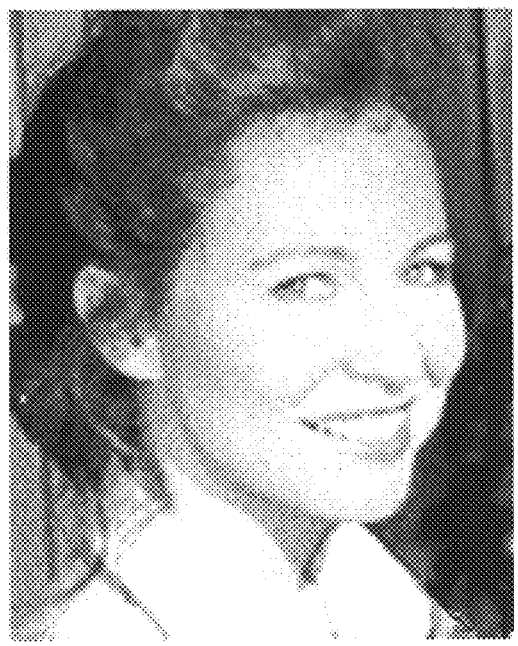
FIG. 6 is a true representation of an image in a .jpg format.

For example, if the image shown in FIG. 6 is to be translated to a true image at a semiconductor chip level, the image must first be compensated for distortion inherent in the asymmetric scaled pixels.

Figure 7:
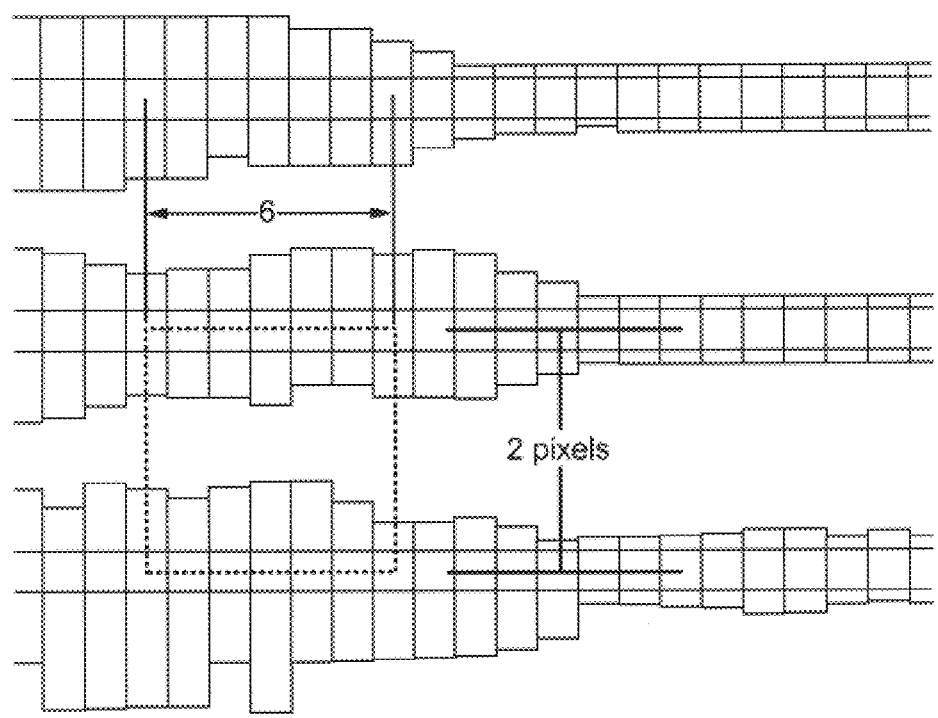
FIG. 7 is a representation of a close up of an image generated by the subject invention showing a matrix of 12 pixels (6×2).

FIG. 7 is representative of a physical layout of a portion of an image formed by the subject invention illustrating within the dashed lines a square portion of an image representing 12 pixels in which in the vertical dimension of the page measures two pixels and in the horizontal dimension measures six pixels. In order to create a correctly proportioned visually perceptible image, the original image must be expanded laterally or compressed vertically in a ratio of 3:1, since the actual layout of pixels can be implemented on a 3 to 1 ratio.

In this particular example, the image will be compressed to account for the asymmetric resolution in the vertical dimension to provide an image after scaling as shown in FIG. 8.

Next, the scale-modified image is converted into a gray scale image after which it may be desirable to enhance the image's contrast or make use of any number of other image manipulation techniques.

Finally the gray scale image is converted to a format which can be read by a program which translates the common image format into a chip layout design data language such as GDSII or GL/1. This encoding will make use of the pixel cells.

Internal to the program is a data structure which represents each pixel's gray scale value as a number. FIG. 9 is a representation of a group of 16 contiguous pixels, each bearing a gray scale level from 0 to 15.

This data structure maps directly onto the frame wire structure of the invention. Conceptually this data structure is shown in FIG. 10.

Each of these locations is translated into a shape on a level of a given name and in a given location the result of which is illustrated in FIG. 11.

Although these images could be mapped to real mask design levels as union-ed polygons, it is preferred to store pixels repeated periodically in a more efficient language construct called a "step and repeat" transform or an "array" transform. For example, if there is a pattern of pixels for the gray level 8 of the top row in four adjacent positions, the four instances will be encoded into one language construct which might read:

Transform PT08 at 10,10 and repeat it twice along the x axis at a delta of 20 and twice along the y axis at a delta of 20.

For images which contain less detail this operation results in significant data compression and it makes it easy to manipulate the pixels later.

In designs which repeatedly use the basic pixel sets, merging techniques can be implemented which rename each image, merge data specific to it and reuse the pixel definitions common to all the images.

The basic technique outlined here is completely compatible with all semiconductor processes known to the inventors. The resulting images can be very complex visually and be structured enough to be incorporated as functional wiring on a chip.

Optimization of Frame Wire Direction.

As mentioned previously in connection with FIG. 7, the resolution available with this frame wire image printing technique offers asymmetric resolution.

Further, it is desirable to encode on the surface of the semiconductor device the most detailed image possible. First, consider a simple structure, consider an image shape where one edge is not orthogonal and where the slope of this edge is anything but 1, the best resolution is obtained on the wafer by running the frame wire on the x or y axis which is parallel to the axis of the most rapid change in the image and where the change can be captured within the variable region on the top or bottom of the frame wire.

FIG. 12a shows an image in which the image is best placed with the frame wire running horizontally, while FIG. 12b is best oriented with the frame wire running vertically.

As hinted at above, the position of the frame wire relative to the image data affects resolution too. Images capable of being created are typically complex and, therefore, a measurement system has been devised to give an approximation of the detail which will be captured given the frame wire directions and pitches used. It is simply to measure the total perimeter and vertex count of all the shapes making up the image after conversion to wires, as would be represented in a physical layout. The measure of change captured is indicative of the resolution which makes it to the resultant image.

Figure 13:
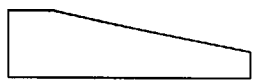
FIG. 13 represents a simple example image where the frame wires run horizontally.
Figure 15:
FIG. 15 represents the simple example of FIG. 12b where the frame wires run horizontally.
Figure 14:
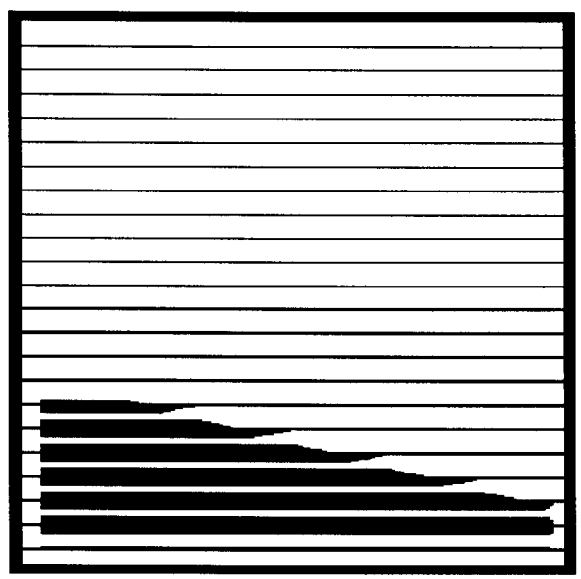

FIG. 13 represents a simple square example image where the frame wires run horizontally. By measurement we find this first image, after encoding, has a perimeter measurement of 1416.22 microns and a vertex count of 240. The resulting image would look something like FIG. 14 on the wafer:

Rotating the image relative to the direction of the frame wires results in an image as shown in FIG. 15.

Figure 16:
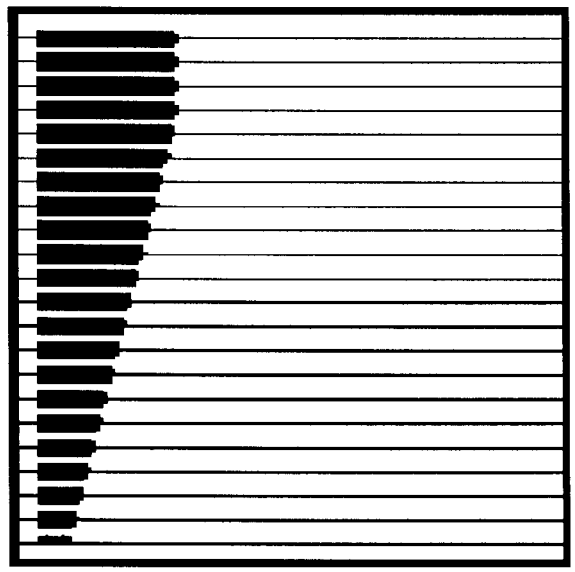
FIG. 16 illustrates the actual appearance of the frame wires of the example of FIG. 12b.

Using the perimeter/vertex measurement method the rotated image of FIG. 15 after encoding has a perimeter measurement of 1443.5 microns and a vertex count of 358. Both measurements are greater than the first image and we predict this encoding of the image will look better. The resulting image would appear as something like FIG. 16 on a semiconductor wafer:

To date it has been found that the perimeter and vertex counts usually track together. Images exist where they do not track together, in which case it is preferable to use the vertex count as the determining factor of resolution. As a rule, running major features perpendicular to the frame wires usually results in the better image, but it does not always hold. This optimization method applies to any printing system with asymmetric resolution.

Figure 17:
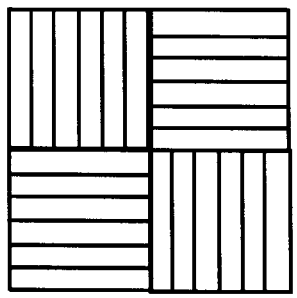
FIG. 17 illustrates a sample layout in which frame wires run in different directions for different visual effects.

The next level of optimization is to subdivide the image and do the optimization outlined above in each subdivision of the image. This subdivision process can be continued until the size of the frame wire within the images drops below the size allowed by the manufacturing process. An image locally optimized might appear as shown in FIG. 17, if only the frame wires are considered.

Complications at the boundaries of the regions can occur where care must be taken to mesh with the pitches running in another direction. It is necessary to either merge the pixels running in the respective directions or maintain an adequate non-image space. The choices made at these boundaries can also be an issue of optimization and one method might be chosen over another based on what is depicted in the image at that location.

The frame wires can also be run at arbitrary angles across the entire image or portions of it. Consider that additional optimizations can occur which are, for example, related to color or to the algorithmic optimizations available in software and it is clear that the optimization space gets very large. In the following paragraphs a few of the more interesting optimizations will be described.

Most Dense Implementation of This Printing Method

The use of the frame wire technique, while allowing circumvention of the restrictions on minimum feature size and density in many semiconductor technologies, also has its limitations in that the frame wire is always present at some minimum width which limits the contrast available. In addition, the minimum pitch of the frame wire plus the maximum delta available for bright pixels limits the resolution available.

It is also the case that, while in most copper processes, there is a stringent local density requirement, in aluminum processes which is preferred for an implementation purely for the purposes of creating images, there are few restrictions on the local density. Further in a process intended only to make images there are no concerns about the integrity of the insulation between wires or the wires themselves in an electrical sense.

In addition, for the purposes of making images only, in contrast to adding images to functional semiconductor devices, it is preferred to make the following enhancements.

Figure 18A:
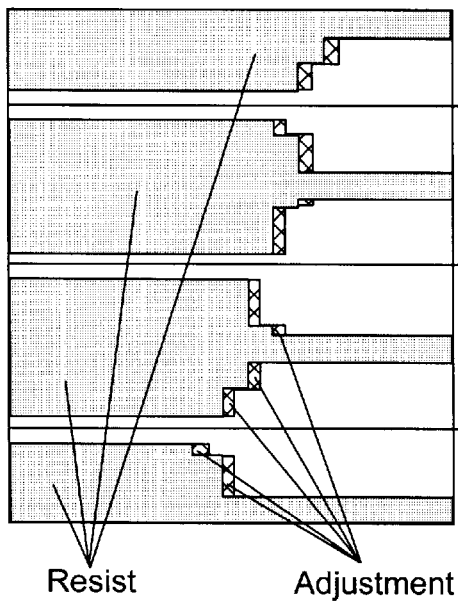
FIGS. 18a and 18b demonstrate how the frame wires can be shrunk to substantially reduce the frame wires to a minimum in order to increase contrast.
Figure 18B:
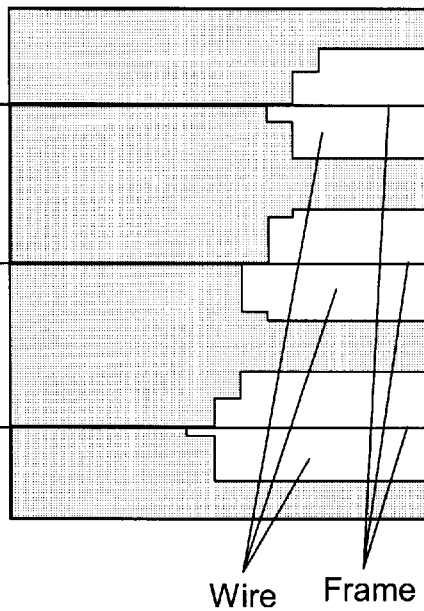

First, using a chemically biased photo resist technique is preferred, as it allows photolithographic images to be altered to reduce actual dimensions on the surface of a semiconductor wafer. While the use of such a technique does not enable a reduction in pitch (line plus space dimension) it does allow the dimensions of either lines or spaces to be altered. Documentation for this method can be found in the paper: "Chemical amplification of resist lines: the CARL process," Microlithography. World (USA) Vol.8, No. 2 Spring 1999 P2, 4, 6 and 16. With this technique, images are exposed with traditional lithography tools and then the CARL process is used to bias or expand the exposed photo resist. This effectively shrinks the frame wire to some 10s of nanometers in size. This effect is illustrated by comparing FIG. 18a with FIG. 18b.

In FIG. 18 the centering of the frame wires is labeled as Frame. The resist regions after the initial exposure on the left and the chemical bias on the right are labeled as Resist. The space which will be occupied by the wires, where the wires are the frame plus the delta in reflection, are labeled as Wire. Finally, because a chemical bias has been applied to the resist after exposure, small adjustments must be made in the shapes to account for the expansion of the resist pattern without introducing error in the amount of reflected light. These adjustments are labeled Adjustment.

The effect of this technique is clear. It drastically shrinks or eliminates the area of the frame wires. It also effectively increases the space between frame wires. This space also cuts into the resolution available.

Figure 19A:
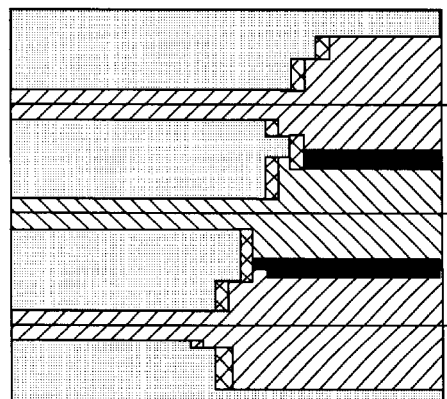
FIGS. 19a and 19b shows how a further increase in contrast can be obtained by using multiple layers of metallurgy and other underlying materials.
Figure 19B:
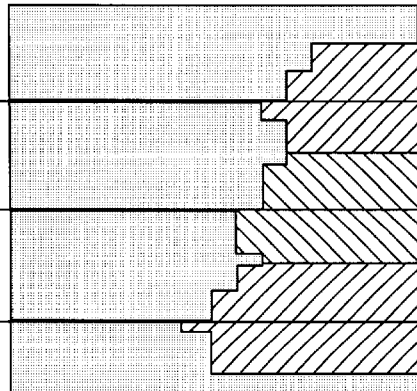

Given the subject image technique is a multi-level one, the space between frame wires can be eliminated by using more than one level of wiring. In the image in FIG. 19, overlap denotes the regions where the first wiring level (Layer1) overlaps or slides under the second wiring level (Layer2). This overlap as well as the frame wires will disappear when each level goes through the exposure and chemical resist bias steps outlined above. (The resist labeled Resist here is not shown accurately as it too will overlap with wire regions and resist regions related to the definition of other layers of wiring.)

Figure 20:
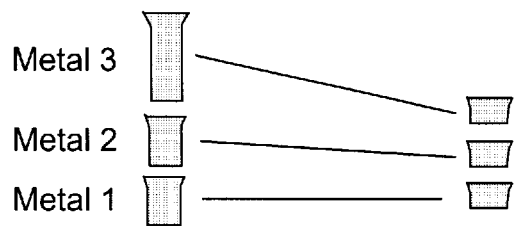
FIG. 20 demonstrates graphically how decreasing the spacing between metal level can be used to increase contrast of an image.

Further, it is preferred that both the metal and the insulation between layers be thinned in this overlapping technique so there is minimal difference in the reflectivity of the metal layers, as shown in FIG. 20.

With this image technique, pixels can be packed edge to edge to the limits of the alignment of the resist exposure tool being used. Further, with additional levels of wiring smaller and smaller individual pixel size can be used to enhance the ability to adjust the size of the individual pixels or reflective areas on all sides.

Figure 21:
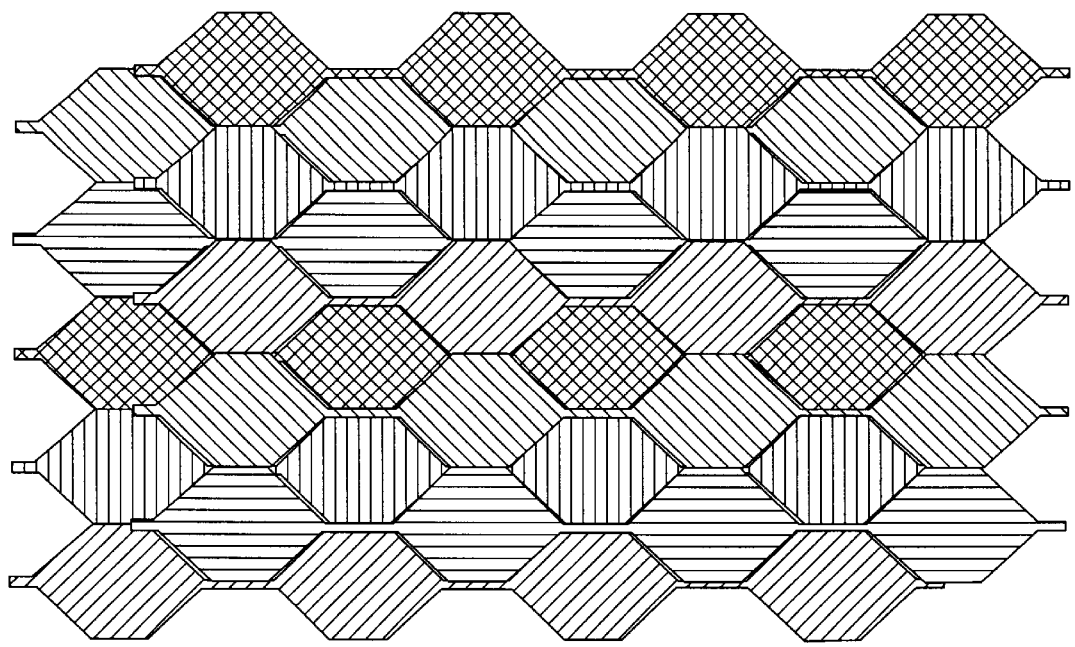
FIG. 21 demonstrates the increase of contrast using five levels of contrasting material.
Figure 22:
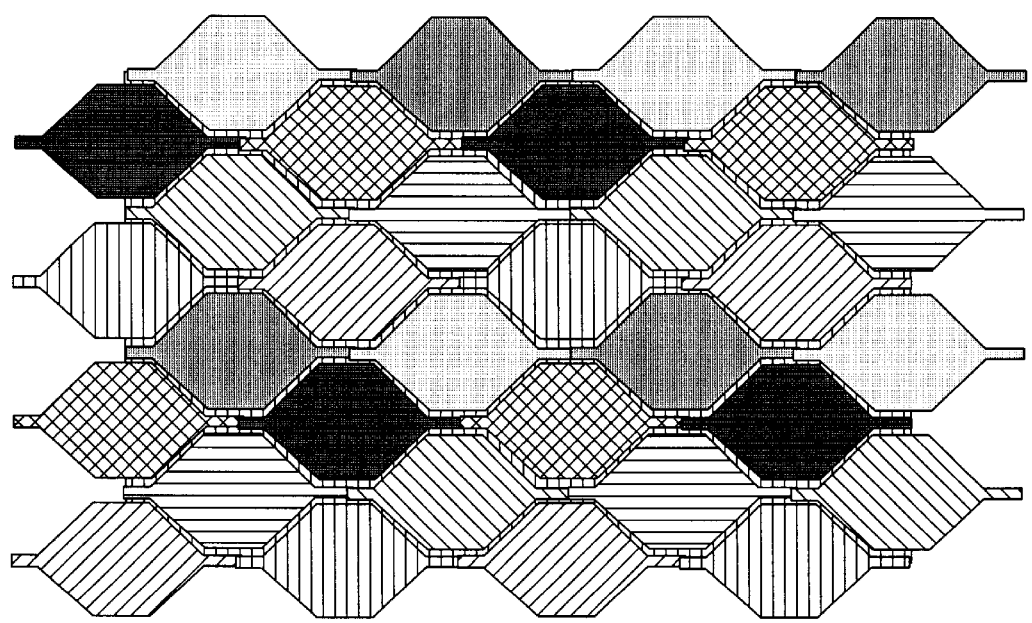
FIG. 22 shows the use of eight different contrasting materials to form an image.

By the use of hexagonal packing and several layers of wiring, pixel sizes and densities which are much smaller than can be accomplished with optical lithography today are possible. For example, five layers of wiring can be used, as shown in FIG. 21, or eight layers could be used, as shown in FIG. 22.

Many more multilayer combinations are possible. What is used will be determined by the constraints faced.

Optical Proximity Correction

Optical proximity correction (OPC) techniques can be-applied to pixels to increase control over the gray levels of our pixels. In most of these applications small features below those which would print alone are added or removed from the mask to adjust the density of photons reaching a particular region of an exposed image.

Figure 23:
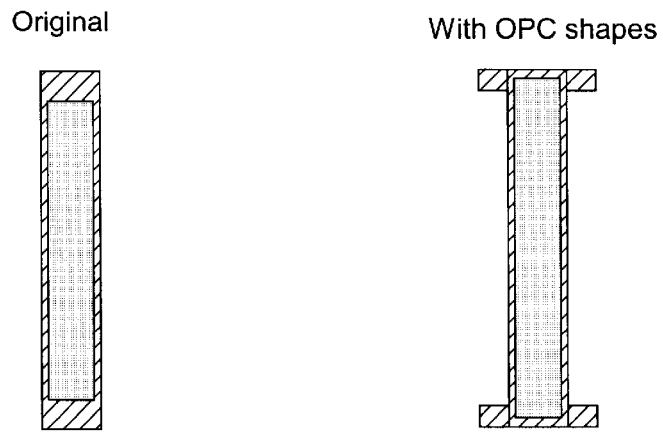
FIG. 23 demonstrates the use of image enhancement by the use optical proximity correction'shapes.

In one classic example of OPC better control line end bias on minimum width lines is achieved by adding small appendages well below the minimum width. These shapes appear on the mask at four or five times the size printed on the wafer but only serve to increase the amount of light within the regions near the line ends. For example, the image on the left in FIG. 23 might print as the rounded shape shown inside of the image. The exposed resist can be increased as shown on the right by adding four wing shapes to increase the light reaching the corner regions of the printed image.

This and many other OPC techniques can be used on individual pixels for more control of reflection regions. We expect in any ultimate implementation of our technique that OPC techniques will be applied.

Pitch Pushing

It is also preferred to utilize another technique for packing more information into an image on a semiconductor surface. As discussed previously, the frame technique has an inherent asymmetric characteristic which is subject to further extension.

Figure 24:
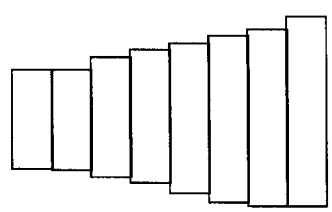
FIG. 24 demonstrates the effect of gradually increasing the intensity of a portion of edge of an image.

In gray scale images, the changes along the frame wire usually increase or decrease in intensity gradually as might be the case with a picture of a human face. A gradual increase or decrease in intensity, for example, is illustrated in FIG. 24.

The steps in this gradual change in intensity can occur at the minimum step size printable with the semiconductor wiring technology being used. It could be tens of nanometers in size and satisfy process dimensional ground rules. Therefore, within the image we can print at a pixel pitch which is less than the minimum feature size of the technology itself.

Figure 25:
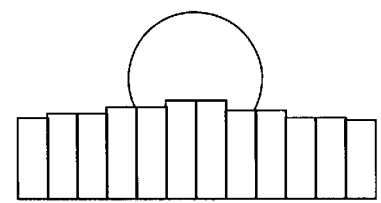
FIG. 25 illustrates that each incremental feature of an image must be a printable feature.

The use of minimum step size can cause problems when the step direction is changed. If the image intensity along the frame wire has a peak or valley, the peak or valley itself must be of a feature size greater than or equal to the capabilities of the technology, if not using OPC techniques. In other words, the nubs and notches in the wires need to be "adjusted." For example, the circled peak in FIG. 25 must be formed of a printable feature which meets the process ground rules. This limitation is a feature of the specific photolithographic tools used and is not a limitation in the invention.

The notches and nubs are adjusted by an algorithm which iterates repeatedly through a "fix notches then fix nubs" loop until no more fixes are being made or until we find ourselves in an oscillation of counter-acting fixes. When this limit is reached all remaining notches and nubs in error are deleted.

In each attempt to fix a notch or nub the sides are simply moved out or in and adjust the depth or height to maintain a near constant reflectivity in the region. During the reflectivity adjustment, notches may be filled in or nubs removed. In some instances, in order to avoid altering the quality of an image, reflectivity and resolution trade offs must be made during these adjustments. Adjacent pixels must be adjusted during these fix up loops to maintain the correct local reflectivity or a trade off in resolution may have to be made at the sacrifice of overall image accuracy.

If the image must meet the ground rules of the process used, such as when the image is part of a functional semiconductor device, the pixel pitch along the frame can only be pushed to about ¾ of the minimum feature size for the wiring level. When using OPC type adjustments, the pitch along the frame wire can be pushed to about ⅓ of the minimum feature size.

Enhancements for Black and White Images

Many of the images which will be encoded with this technique contain only two levels of gray—they are black and white. Images for a microfiche application would often meet this criteria. The basic method of the invention can be modified to support black and white images more efficiently as illustrated in the following paragraphs.

1. Change the Basic Pixel Structure

Figure 26A:
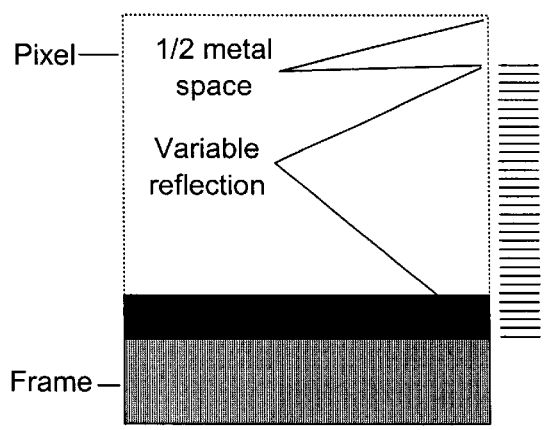
FIGS. 26a and 26b illustrate modifications of a frame wire pixel for use with binary images.
Figure 26B:
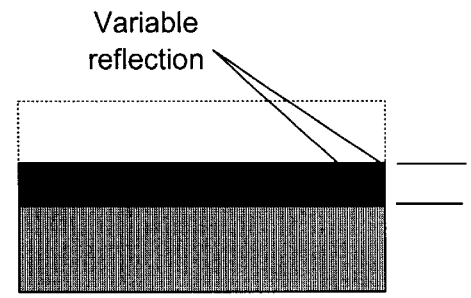

The first approach is to use pixels containing only two reflection areas instead of the N levels of gray normally used. For example, instead of the pixel shown in FIG. 26a, the pixel shown in FIG. 26b can be used and still resolve an image or character to be printed. Some contrast is lost and images look more like images faintly stamped into the "page" but much less space is used.

2. Drop the Frame

Another option for saving space is to drop the frame wire altogether in black and white images. Where there is white there will be adequate width so long as the pixel is defined so that the delta to white is at least ½ the minimum metal width.

In order to demonstrate the desired technique, the three letters in FIG. 27 will serve as an example. Using the technique of the invention the white represents the reflective metal which will be equivalent to white paper on which to print and the lack of material or reflection will be equivalent to the ink.

The converted image as formed for printing on the wafer with out any enhancement is shown in FIG. 28. An enlargement of the character B is shown in FIG. 29. Highlighted in a cross hatch pattern are regions in the image which do not follow manufacturing ground rules of processes typically used to build semiconductors. That is, the width of the metal (white) is less than an acceptable dimension.

An algorithm is applied to correct these manufacturing problems. In the first step a representation is built of the character which is not cut by the spaces between the frame wires, as shown in FIG. 30. An aside, it should be pointed out that while alphabetic characters are described in this example, the same techniques apply to black and white images in general. There is a lower bound for the minimum feature which can be encoded using our correction algorithm of at least two pixels. For large features of perhaps 20 or more pixels in size, the process simply drops the fine detail (small width) portions because enough detail is encoded in the pixels at full black or full white.

This approximation of the character (FIG. 30) is then used to find all enclosed regions within the character. In other words all regions in the characters one might fill in with a pencil. In the figure these regions are represented the solid lines crossing the open portions of the letter. This region is used to fill in the enclosed regions and in this way fix many errors. FIG. 31 shows the image following this process where the original errors remain in cross-hatching and newly introduced errors are shown as dark X's near the center of the letter.

In the next step, an envelope is formed which covers the character by an expansion amount of about one-half the wire width plus a space. Then an envelope is cut, which closely follows the outline or convex hull of the character, out of the middle of the larger envelope. This defines a working region which runs like a fat border around the outside of the character. Then the existing paper and a slight modification of the character are removed from the fat border shape. As a final step, portions too thin to be legal or which would cause other manufacturing problems are removed. These border fix up shapes are now merged with the shapes already part of our paper to form the version shown in FIG. 32.

Figure 33:
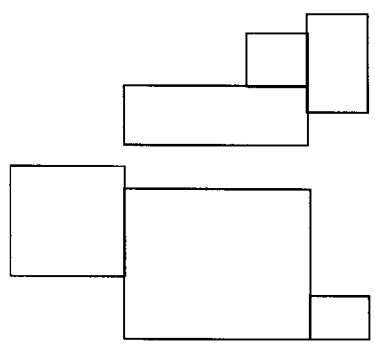

The resulting pattern has only a few manufacturing issues to clear up as can be seen in the image of FIG. 32. The remaining error is illustrated as an enlarged region in FIG. 33. It may that very tiny connections are formed between the shapes and they need to be removed.

Figure 34:
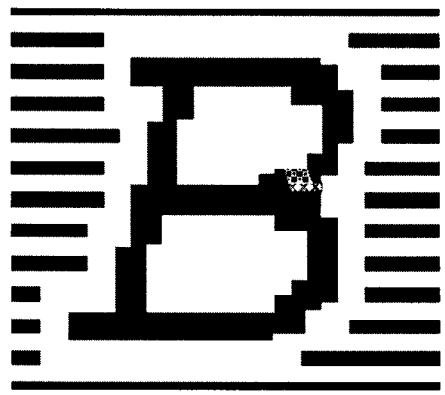

These regions can be manipulated until the shapes are adequately separated. After this manipulation, the result appears as shown in FIG. 34. The error is not eliminated but has been altered to become a space when it previously had been a notch.

Figure 35:
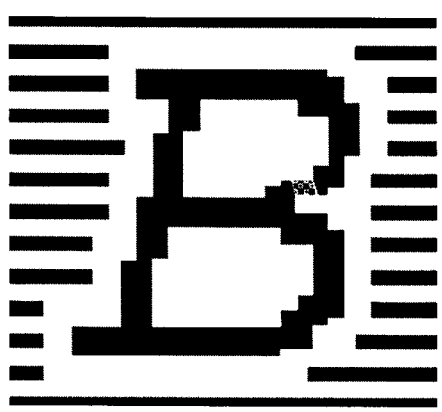

Next, all the remaining width problems, shown in cross hatching in FIG. 34, are fixed. This is accomplished by adjusting the edges of the shape until the problem is eliminated or the resulting image is constrained by another limit. While, not shown, if a minimum width cannot be met, shapes which are immediately adjacent to the area are adjusted in an iterative fashion. If after a number of iterations there is no overall reduction in the number of width problems, the process stops and portions of material which are too thin are simply deleted. The results of the width fix up, as shown in FIG. 35, indicate that the gap at the center of the letter has been widened.

Figure 36:
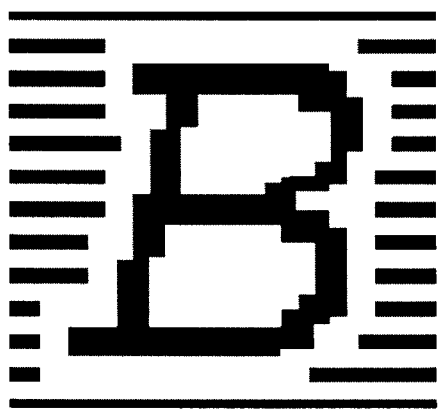
Figure 37:
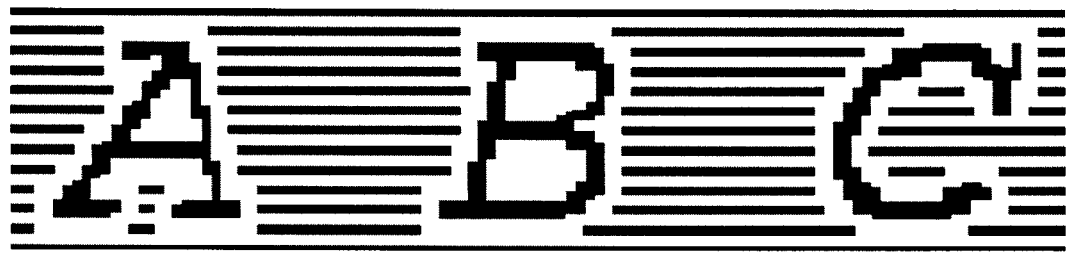

Spacing violations are dealt with next. These are always introduced by earlier steps and can be fixed by interactively cutting into the width of adjacent shapes if these shapes are larger than the minimum width. Because the spacing errors are introduced by the process, the last resort fix is to remove the pixel we made larger in the first place. After this step the letter appears as shown in FIG. 36, while the entire image is shown in FIG. 37.

The next steps are introduced to further improve the image. In the first step some of the smaller enclosed regions in the background wires or "paper" which are near the characters are removed.

As a final, mostly cosmetic, step the inside and outside corners of the parts of shapes related directly to the character are smoothed. In this example the smoothing can be done with global parameters. That is, all of the corners are uniformly smoothed.

Figure 38:
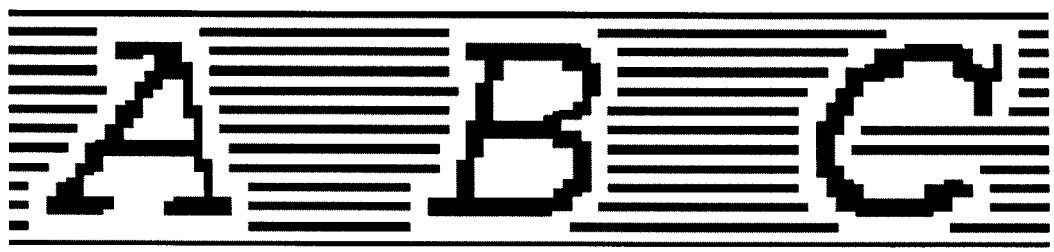

It is also possible to smooth intelligently. For example, if the original image had been scanned at a very high resolution and there is insufficient area budget to provide for this resolution in pixels, the higher resolution can be used to more intelligently smooth the edges. "Pixel shaping" will be described in more detail below. The final image is shown in FIG. 38.

As important as appearance is, the image is within the process ground rules in all semiconductor processes of which the inventors are aware. In a technology based on minimum sizes on the order of 0.25 micron, these characters are only a few microns on a side.

3. Drop the Frame and Use Predefined Character Set

In situations where it is permissible to use a fixed character set, instead of applying after the fact fix up as in the previous method. Here, a standard character set is predefined and simply cut and placed in a hole in the paper into which we insert each character. Such character sets can usually be represented more compactly with this method because the character set can be highly optimized.

Next, a hybrid physical and algorithmic method for very high resolution black and white images will be described.

Although the typical pixel size implemented here is almost an order of magnitude smaller than the two-micron grain size of photographic film, our technique, fabricated in current semiconductor technologies, is burdened with the overhead of the frame wire and a minimum space between full white pixels in the single level implementation.

Although it is possible to generate smaller pixel sizes, for example, by using the 25×25 nanometers sizes possible with e-beam or fib techniques when storing black and white images, the subject technique has other trade offs. For example, most customers won't want to work with images this small because of the expensive tools required to see the images at this resolution.

A hybrid analog and digital encoding technique which takes advantage of the ability to store gray levels very efficiently allows increments of 10 nanometers and smaller, with more specialized tooling, to store higher resolution black and white images.

Figure 39:
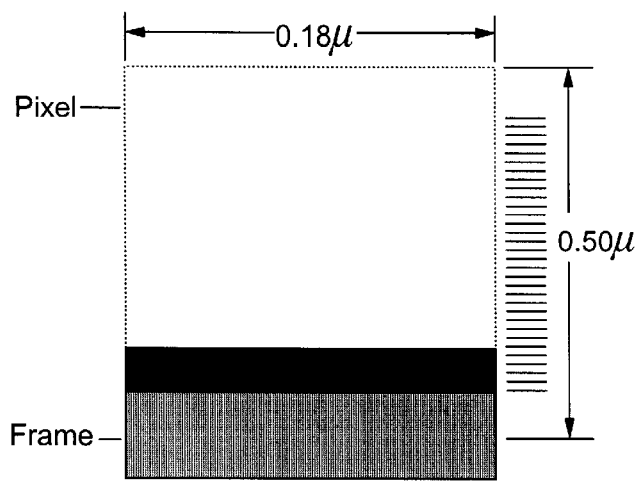
FIG. 39 is a representation of a 32-bit-level frame wire pixel implemented in a 0.18 micron semiconductor technology.

Here is how one implementation of the technique works. Starting with a 0.18 micron technology where 0.01 micron steps can be resolved in the shapes printed, 32 levels of gray providing 5 bits of resolution provides a basic pixel cell structure which would look as depicted in FIG. 39.

Figure 40:
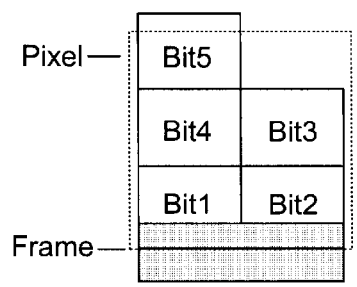
FIG. 40 is a logical representation of the placement of each of the five bits for a 32-bit pixel.

For the purposes of information content the five levels can be thought of as five binary pixels arranged over the pixel as shown in FIG. 40 in the following way. The arrangement chosen provides for both density and a reduction in error when the algorithmic enhancement is applied.

Because the method reads gray levels and turns them into a fixed number of dots, either black or white, it is important to minimize the impact of any potential miss read of the gray level. For example, if using a traditional binary numbering system where there is a mis-read of the gray level 7 (00111) as the level 8 (01000) the number of pixels colored in error will be four.

If a level is miss-read, it is preferable to introduce an error of equal impact at any gray level. There exists a binary code called the grey code binary number system which does just this. In this code as the count is incremented, never more than a single bit in the binary code changes at a time. This code is used with some enhancement here. Below is the binary grey code enumerated for the 32 levels which can be represented by our pixel in this example.

| Number  | Binary | grey code |
|---------|--------|-----------|
| 0       | 00000  | Black     |
| 1       | 00001  |           |
| 2       | 00011  |           |
| 3       | 00010  |           |
| 4       | 00110  |           |
| 5       | 00111  |           |
| 6       | 00101  |           |
| 7       | 00100  |           |
| 8       | 01100  |           |
| 9       | 01101  |           |
| 10      | 01111  |           |
| 11      | 01110  |           |
| 12      | 01010  |           |
| 13      | 01011  |           |
| 14      | 01001  |           |
| 15      | 01000  |           |
| 16      | 11000  |           |
| 17      | 11001  |           |
| 18      | 11011  |           |
| 19      | 11010  |           |
| 20      | 11110  |           |
| 21 (31) | 11111  | +----+ White. |
| 22 (21) | 11101  | \| Move to Bottom. 2 LSBs next to frame |
| 23 (22) | 11100  | \| to minimize effects of 2 bit error we |
| 24 (23) | 10100  | V introduce. |
| 25 (24) | 10101  |           |
| 26 (25) | 10111  |           |
| 27 (26) | 10110  |           |
| 28 (27) | 10010  |           |
| 29 (28) | 10011  |           |
| 30 (29) | 10001  |           |
| 31 (30) | 10000  |           |

Figure 41:
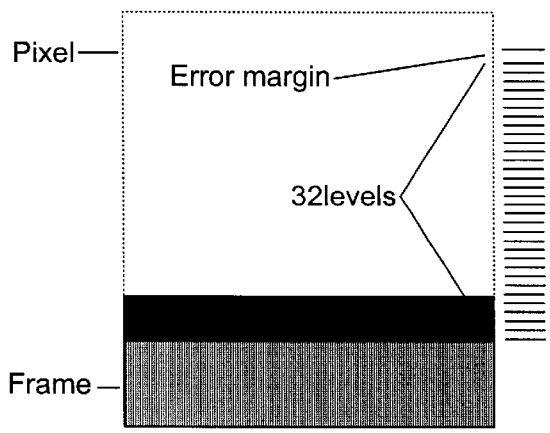
FIG. 41 is a representation of a modification of the arrangement of the 32-bit pixel to avoid errors when the gray level is miss read by one level.

The first enhancement is the need to move the full ON (or white) encoding to the last position to enable the white space compression method as discussed below. This introduces the possibility of a two bit error between gray levels 21 and 22. It also introduces a potential 4 bit error at the end of the list. The impact of the first two bit error is minimized by positioning the two least significant bits against the frame and adjacent to each other. To minimize the error possible at the end of the list it is preferred to introduce some error margin intentionally in the basic pixel design (this could be done around 20 and 21 too). This modification to the pixel would change the basic pixel structure in the example to the structure shown in FIG. 41.

This scheme for dealing with the error margin enhances the appearance of the lower resolution analog image by making any pixel intended to be completely dark, visibly darker than the surrounding pixels which are potentially some level of gray.

Working with a small example of a black and white image scanned at density beyond the physical pixel resolution used for what ever reason. FIG. 42 illustrates a shape sitting on top of a 3×3 matrix of our physical pixels, but which has been scanned at 5 times that resolution. The black (0s) and white (1s) at the higher resolution are shown on the right side.

Considering how this binary image maps onto our 9 physical pixels provides an image something like FIG. 43a. The 9 pixels are labeled P1 to P9 and below each pixel label is shown how the virtual sub-pixels map to the modified binary number system. Finally, in each pixel there is indicated the grey code level which corresponds to the binary number. FIG. 43b shows the actual physical implementation showing the reflective wires which would actually be built on the semiconductor.

If the image encoded as above were looked at visually, the image would appear with a much reduced resolution and accuracy. If the image is acquired by some techniques whereby the gray levels of each pixel can be measured or the dimensions of each pixel can be measured, a computer program can be applied which will convert the low resolution image to the higher resolution image on the right. In effect, both a low resolution and full resolution image have been stored on the semiconductor device taking advantage of what can be done well with typical semiconductor processes, namely the very precise control of the shapes which make up a typical semiconductor.

In actual implementations more 'levels' of gray can be encoded in the analog image by varying the shapes even more. For example, the way in which changes from one gray level to the next is made can be varied by employing OPC techniques described elsewhere to achieve many more levels of gray and hence more reconstructible image resolution.

The need to deal with the large blocks of white which exist in many black and white images especially printed text is dealt with next. Compressing the white space in digital representations is a well known technique and there are many methods to accomplish this compression. Compression of the white space is also implemented in this hybrid approach and the technique is unique in how it couples with the image forming method.

Figure 44:
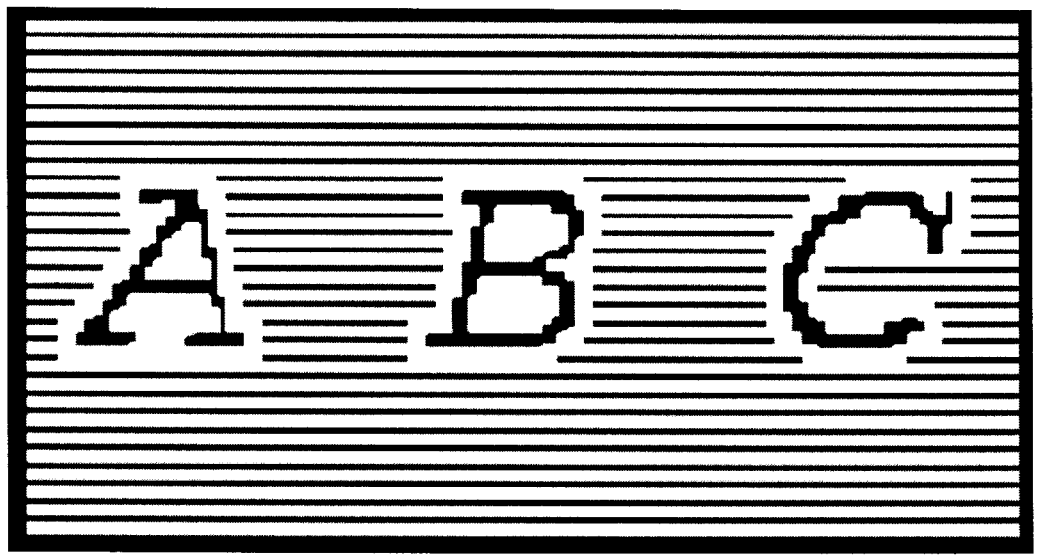
FIG. 44 shows a graphical image containing an excess of unnecessary information.
Figure 45:
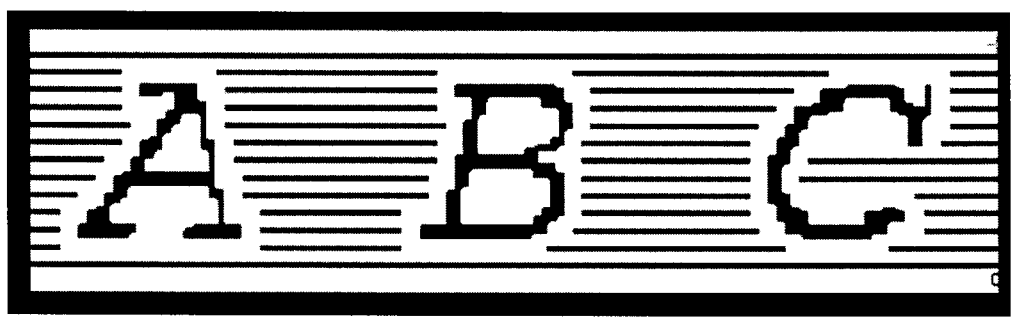
FIG. 45 shows a refined image of that shown in FIG. 44.

Starting with the image shown in FIG. 44, it can be seen that much of the white space on the top and bottom is redundant and could be compressed without the loss of information. By compressing adjacent white lines into one line which is one step wider for each white pixel lines compressed. The result is shown in FIG. 45.

For example, three white lines would be represented with one white or reflective line which is two steps larger than a normal white pixel line. This larger than normal size would be seen in our analog image and by computer program expanded into the full resolution image. The image can of course be partitioned into subsections and this optimization carried out in each of these subsections. Variations are many, but the central idea is to encode an analog image which is usable, but has a lower resolution. Into this analog image information is encoded which can be used to build a virtual image which has much more resolution.

A variation of this technique should be mentioned too. One would most often use this hybrid method to compress the images so as to store the most information in the least space for say a hardened microfiche application, but one can also use the white space saved to increase the amount of resolution available for the printed regions. With this method one would encode the image in a fixed space—but the printed portions of the image would be enlarged on the analog pixel background so more detail could be encoded. To reverse this scale up in size, when the virtual image is reconstructed, one would scale the printed portions of the image down in size while still maintaining all pixel information. The scaling factor would be taken directly from the ratio of the image size after program decompression of the white space to the original image size.

The final hybrid variant to be discussed is the mixing of true gray scale images with black and white images. With the subject technique, to store a page of text which contains a grey scale image, it is most efficient to store the text portions as black and white images using some of the techniques for black and white images mentioned herein. And where there are gray scale images, they should be stored as gray scale encoded images using grayscale pixels on a frame. The strength of this image technique is grayscale so converting gray scale images to black and white dots, while it will work, is not optimal.

The last topic related to black and white images and is seen in the following example. One might have a microfiche application and desire to encode with the methods outlined in this section the packing of images on the semiconductor wafer. Suppose 20,000 pages of printed records are intended to be stored on a semiconductor wafer, unlike most microfilm techniques, the images of this technique will not all be the same size when encoded on the wafer.

Figure 46:
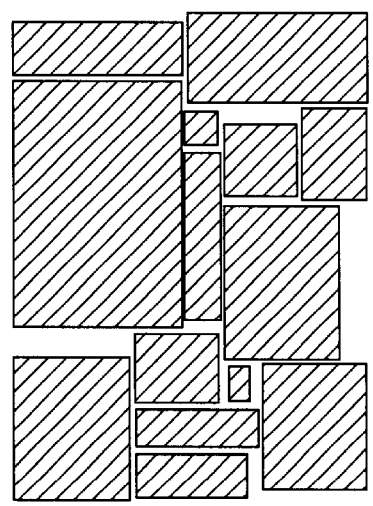
FIG. 46 illustrates a larger cross section of a semiconductor device containing a large number various sized image segments.

Instead of wasting lots and lots of space using the traditional row and column storing of the images, it is preferred to efficiently pack the images on the wafer using tools used in logic circuit placement. Packing tools like these exist and are used today for the planning and placement of devices, circuits and macros on our semiconductor chips. The resulting placement of images will appear as shown in FIG. 46.

The matter of indexing images packed in this way becomes an issue. The images for pages 1,244 and 1,245 in a row and column scheme could be located anywhere. Further, page 1,245 will probably not be next door to 1,246.

The following indexing scheme for physically compressed digital/analog hybrid images is proposed. In a fixed position at the top of each collection of images we will specify a list of entry points or entry locations into a system which most resembles a doubly linked list data structure commonly implemented in computer programs. The header would look something like FIG. 47 on the wafer.

The numbers and coordinates are self explanatory and in practice would probably be computer read so navigation could be automated. The Pointer serves as both an analog hint about the directions to the image and as the origin for the offset in the x and y dimensions.

Figures 47, 48, 49:
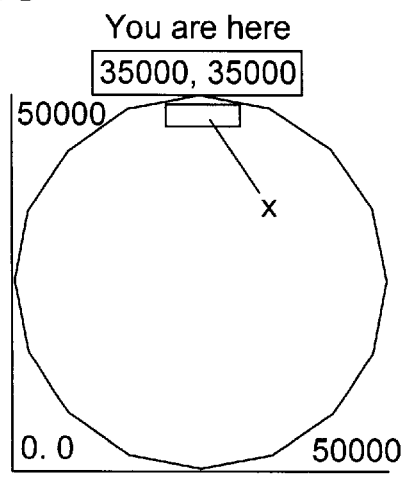
FIGS. 47, 48 and 49 represent notational representation of the header information for data base indexing of image files stored on a semiconductor device.

Each image on the wafer would contain the following header, shown in FIG. 48. Spread throughout the images on the wafer would be you are here markers which would look like FIG. 49. The intent is to provide both analog manual navigation aids and something which could be automatically read.

Pixel Shaping

The pixel structure used at a given position is determined by the technique discussed above. The technique breaks the images, gray scale or color component, into a grid of numbers. This grid represents the intensity of each pixel and how these values are mapped onto pixel structures.

Figure 50:
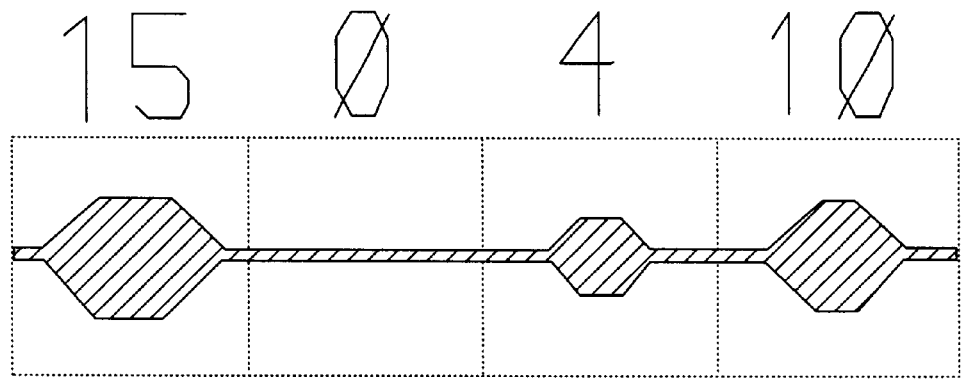
FIGS. 50, 51 and 52 demonstrate various different pixel shapes which can be used to implement images of the invention.

A capability unique to this approach is pixel shaping. If hexagonal pixels, as shown in FIG. 50, illustrating for full white (15), full black (0), gray (10) and gray (4) in a system with 16 levels of gray per pixel, all formed using the frame wire technique.

Figure 51:
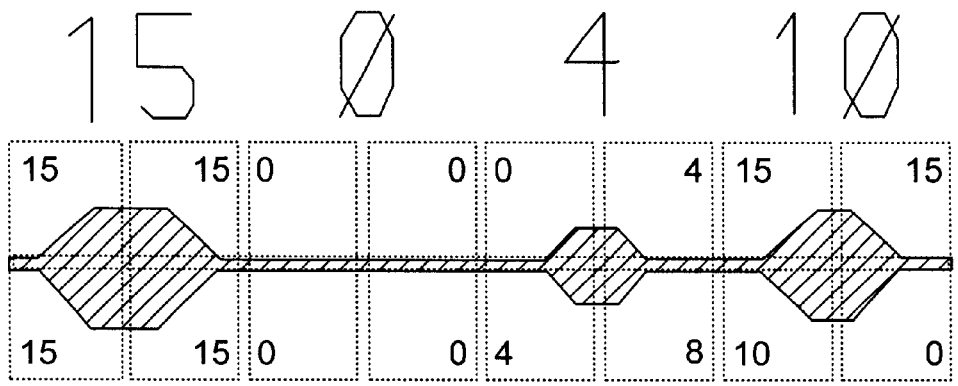

If mapping a higher resolution image than illustrated, either because the original image contains the detail or because a computer program adds extra per-pixel information, each physical pixel can include the equivalent of sub-pixels. These subpixels can more accurately replicate the image to be printed. Thus, the four pixels of FIG. 50 can become the 16 sub-pixels of FIG. 51.

Figure 52:
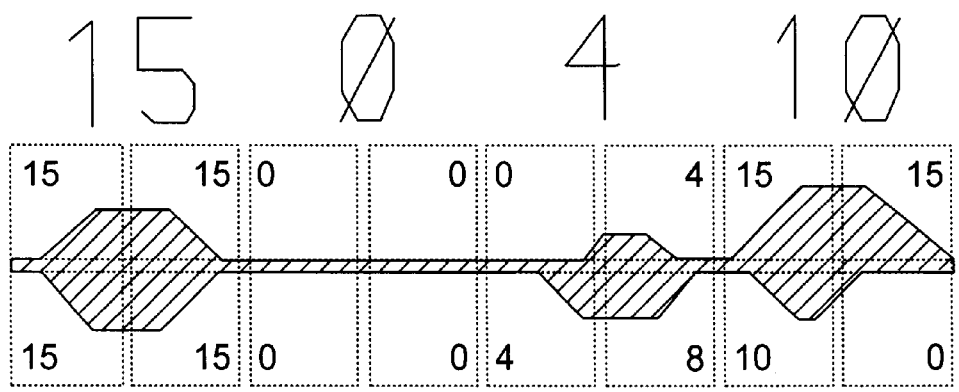

Further, the sub-pixels can be modified as separate pixels by further shaping resulting in the image shown in FIG. 52.

The basic idea is to use resolution beyond the physical pixel resolution, if available, to shape the reflective material so that it more closely follows the image while staying within the constraints of whatever our basic pixel structure requires. And while not shown, the frame wire can be part of this pixel shaping adjustment and pixels can also be merged.

This example also highlights the difficulty in quoting ultimate resolution numbers for this semiconductor imaging technique. Although there is a raw pixel pitch which is fixed, adjustments to the edges of shapes can be as small as 10×10 nanometers. Often resolution can be built into semiconductor images which is well below the raw pixel size.

Inverted Images

Next will be described the inherent and interesting characteristic of image inversion of the subject invention.

When the light source used to illuminate images of the invention is perpendicular to the image frame wires and at an angle of say 45 degrees to the plane of the image, an inverted version of the image can be seen when looking down on the image from above.

This inverted image is similar to, but not identical to, a photographic negative. It is not a perfect inversion. A large part of this effect can be explained because of the optics of the basic structure of the semiconductor device.

Improving the quality of the inverted image may be important in low end applications. The vast majority of cheap microscopes include a light source, i.e. a dark field, which will produce the inverted image. One could create an original image that was inverted so that the true image could be seen such microscopes. It is of course possible to build a microscope where the light source comes through the lens system, but these are slightly more expensive and not necessary except with opaque and reflective objects like semiconductors.

As a first step in understanding the inversion we need to understand that the top surface in our damascene metal process is polished. It is a good mirror and the light which hits it is cleanly reflected. The light which hits the other surfaces of our metal or other wiring materials not polished will be more dispersive or diffuse when reflecting.

Figure 53A:
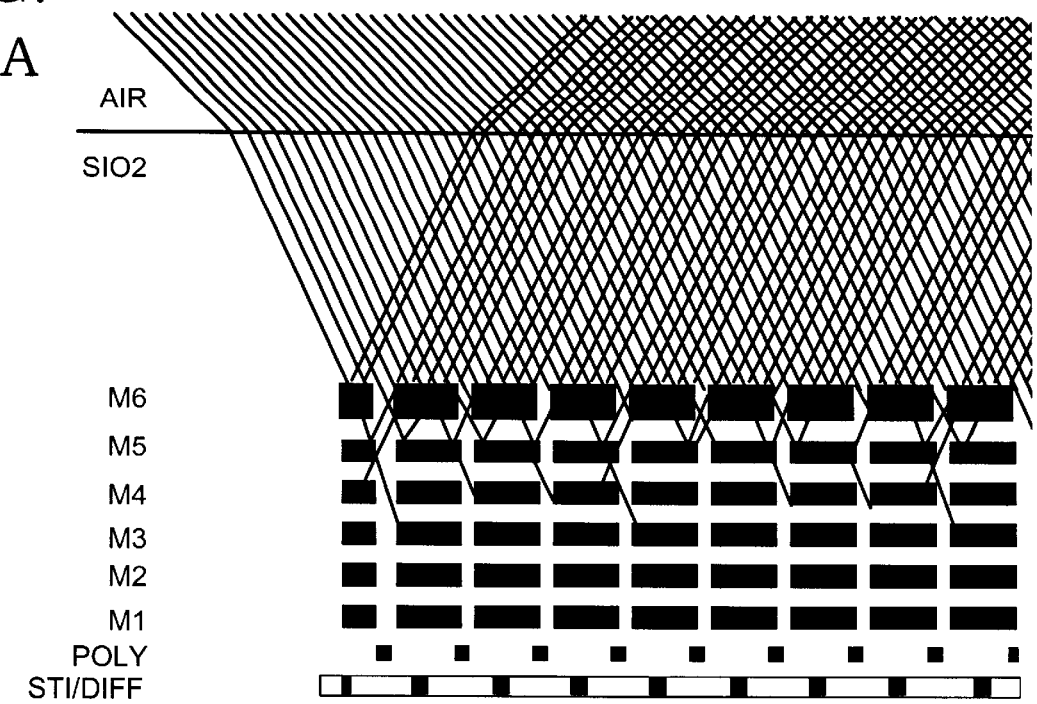
FIGS. 53 and 54 are cross sections of a semiconductor chip showing three (a), six (b) and nine (c) reflections of ray images in a technology having six levels of metal interconnection plus a polysilicon level.
Figure 53B:
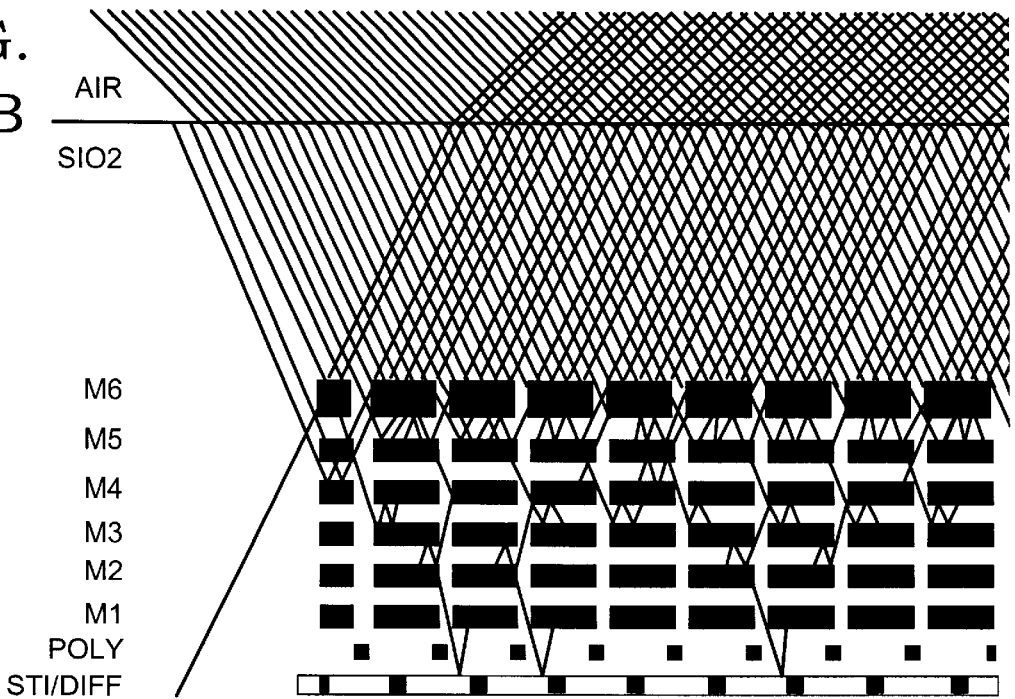
Figure 53C:
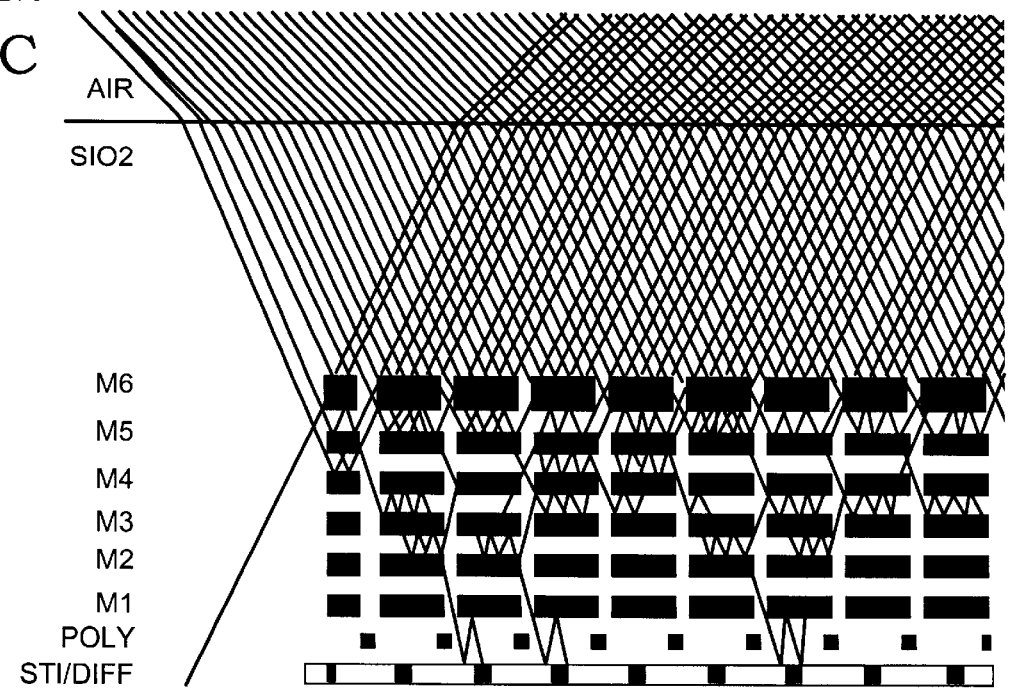

FIG. 53 shows a cross section of an image which is full white with 16 levels of gray. If one views the surface and follows light rays reflecting according to geometric optics and coming into the image at 45 degrees, the following reflections can be seen at three (FIG. 53a), six (FIG. 53b) and nine 9 (FIG. 53c) reflections.

Figure 54A:
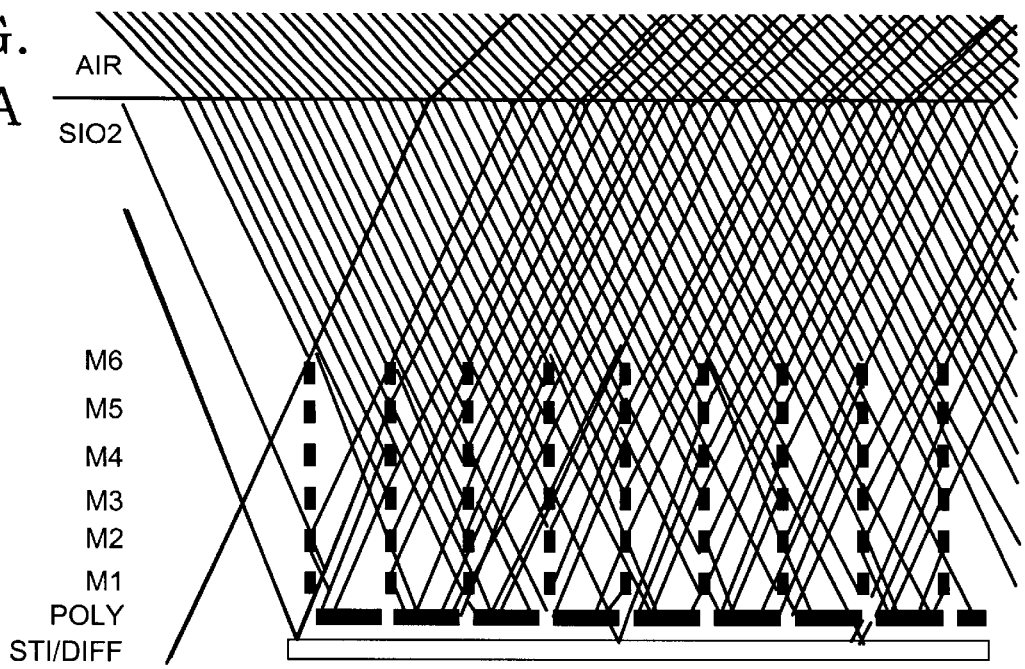
Figure 54B:
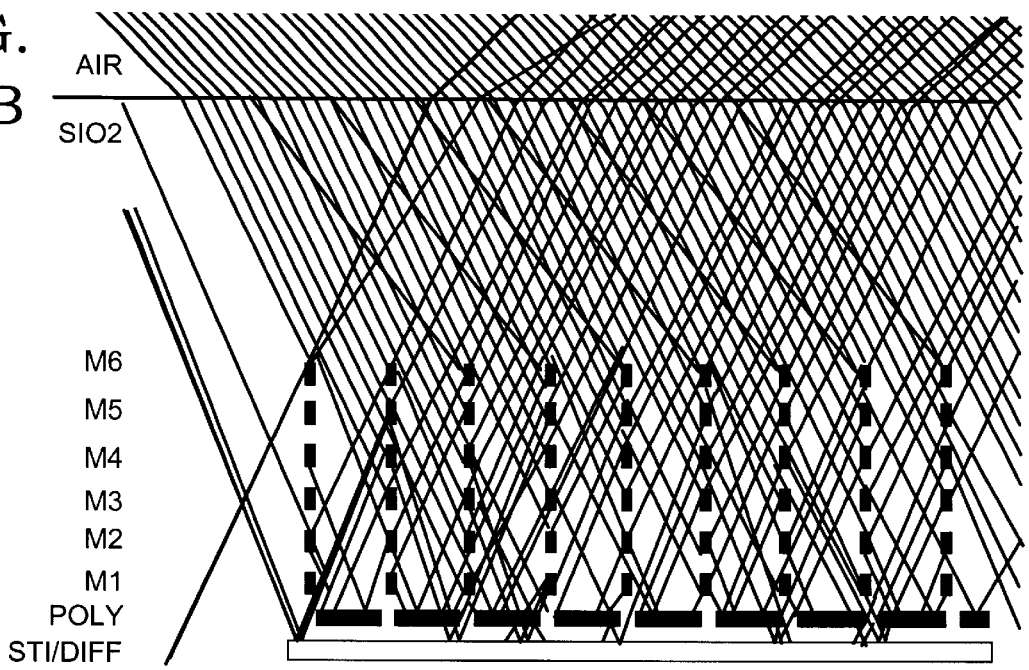
Figure 54C:
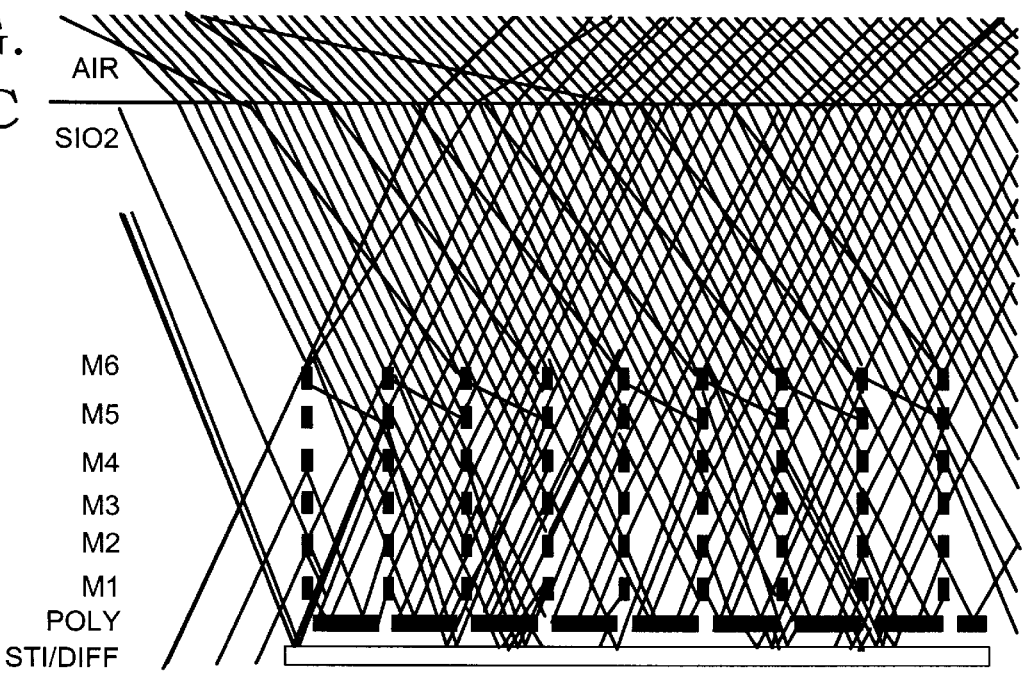

Likewise, if one looks at the part of the image which is full black, as shown in FIG. 54, one would observe the following for three (FIG. 54a), six (FIG. 54b) and nine (FIG. 54c) reflections.

Several things are immediately apparent. First, in the inverted image the full white pixels (FIG. 53) appear dark because most of the light is being reflected out the top side of the image opposite the light. In looking directly down at the image one will not see this reflected light. The full dark pixels (FIG. 53) appear bright because so much of the light is hitting the sides of the metal wires most of the way down the stack of material. The sides of this metal will glow and a significant portion of the light will go 'straight up'.

It is also apparent that light is bleeding into adjacent pixels in the inverted image. This can in fact be seen in FIG.

54, above. Further, if one looks at all 16 grey levels it will be seen that the gray levels are shifted bright and that there is not a lot of definition between the gray levels. Thus, resolution is lost in the inverted image.

There are some compensations which can be made in the construction of the image to improve the quality of the inverted image, or which can be used to add special effects to an image for the purposes of security or novelty.

Figure 55:
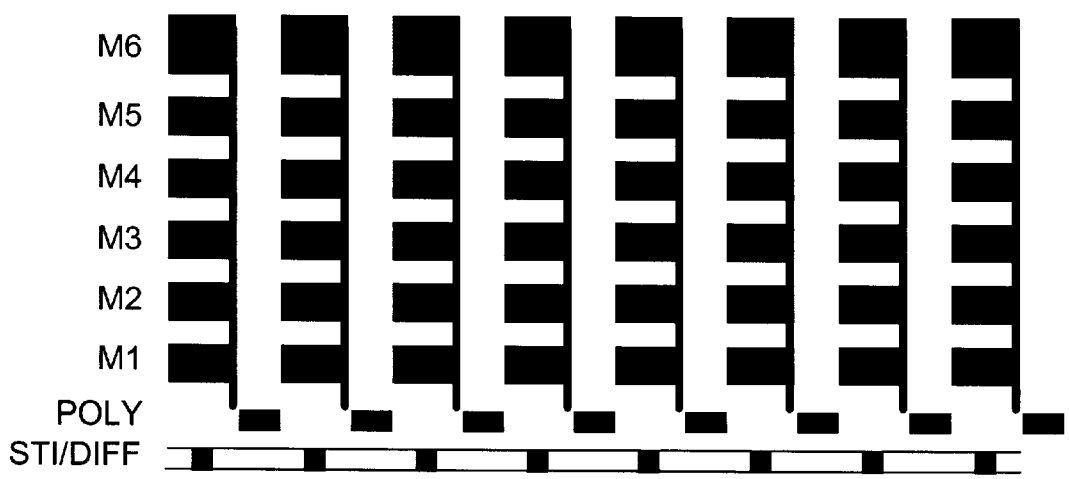
FIGS. 55 through 62 are cross sections of semiconductor implementation of the invention showing variations in the formation of metallurgy lines and vias.

First, the bleeding from pixel to pixel can be addressed by changing the process to eliminate the open space between the levels. This could be done either by eliminating the space between the layers of material or by making use of the dual Damascene metal process currently practiced where one would use the interconnect via layer as a barrier as shown in FIG. 55 to completely block cross reflections. Various other structures may easily be envisioned which will alter the basic optical structure of the semiconductor devices.

Figure 56:
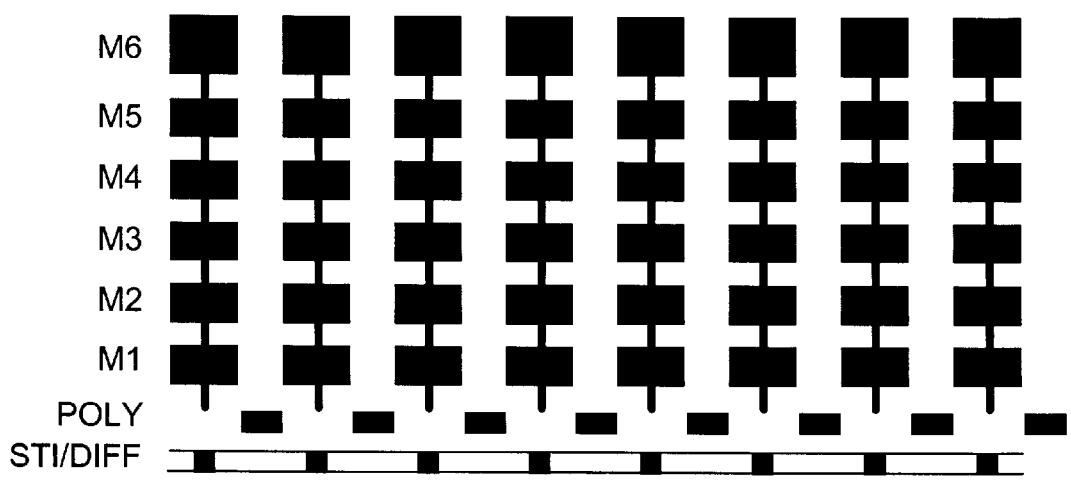

FIG. 56 showns the use of a continuous via extending from the center of the line portion of each level of metal in a semiconductor device.

Figure 57:
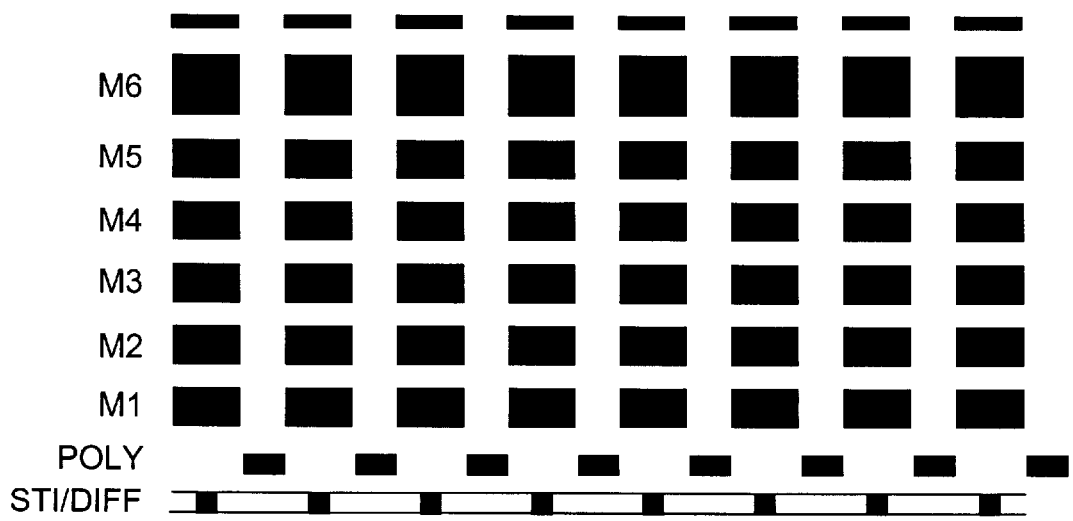

FIG. 57 shows the use of the line portion of each metal level and allows some cross-talk between pixels.

Figure 58:
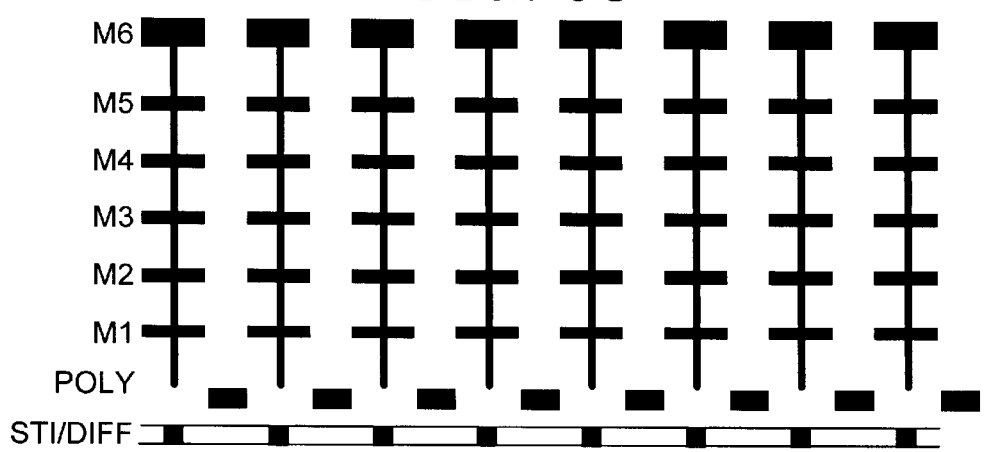

FIG. 58 shows an embodiment not intended to utilize the actual wiring levels in a semiconductor device and, although depicted on a semiconductor substrate need not be so constructed. Here the thickness of the reflective/absorbing materials may be of constant thickness.

Figure 59:
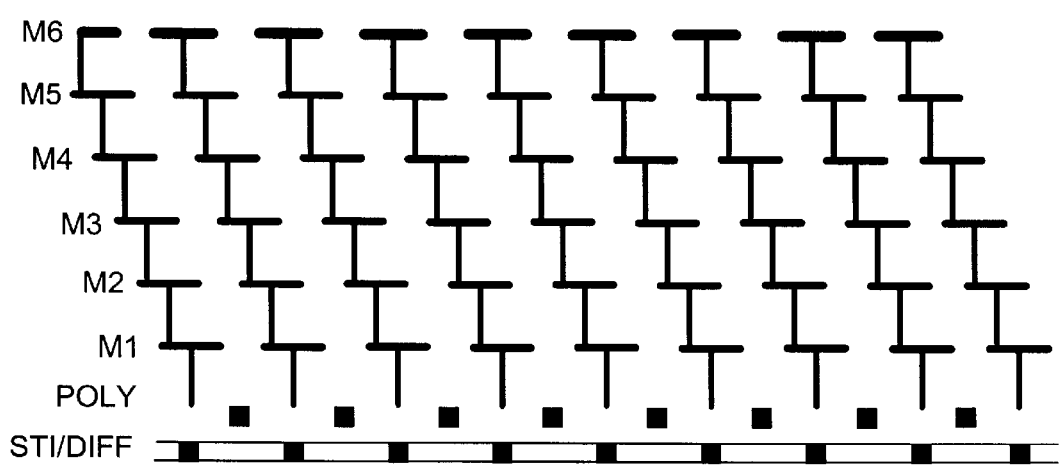

FIG. 59 shows yet another embodiment in which the T-shaped conductive layers are used.

Figure 60:
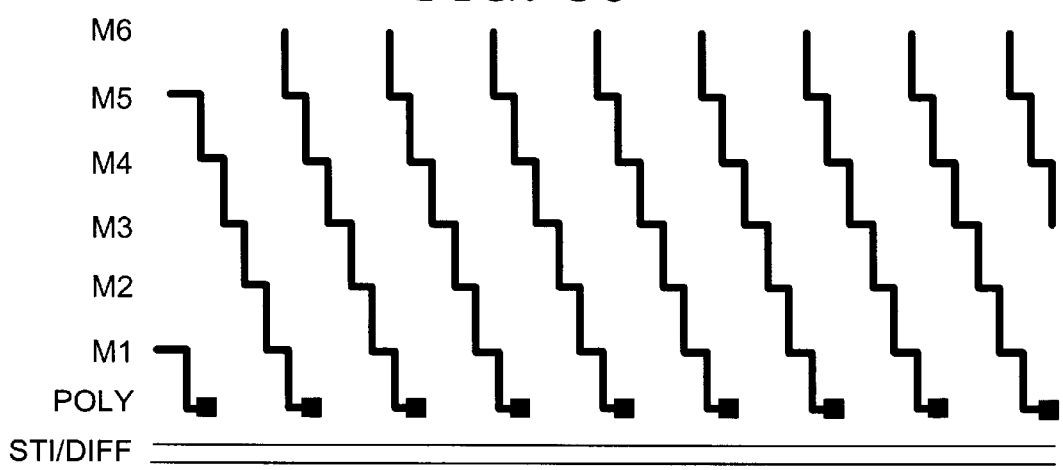
Figure 61:
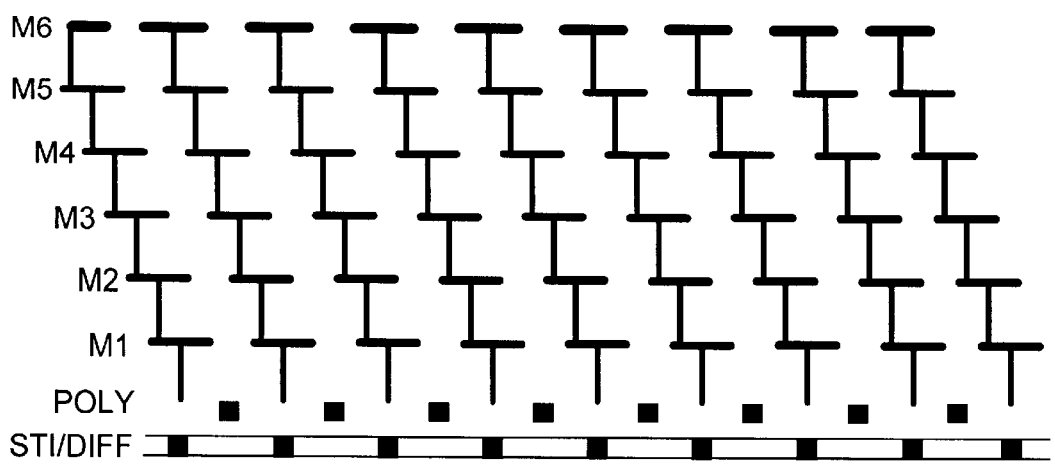

FIGS. 60 and 61 demonstrate yet additional variations in embodying the invention.

Figure 62:
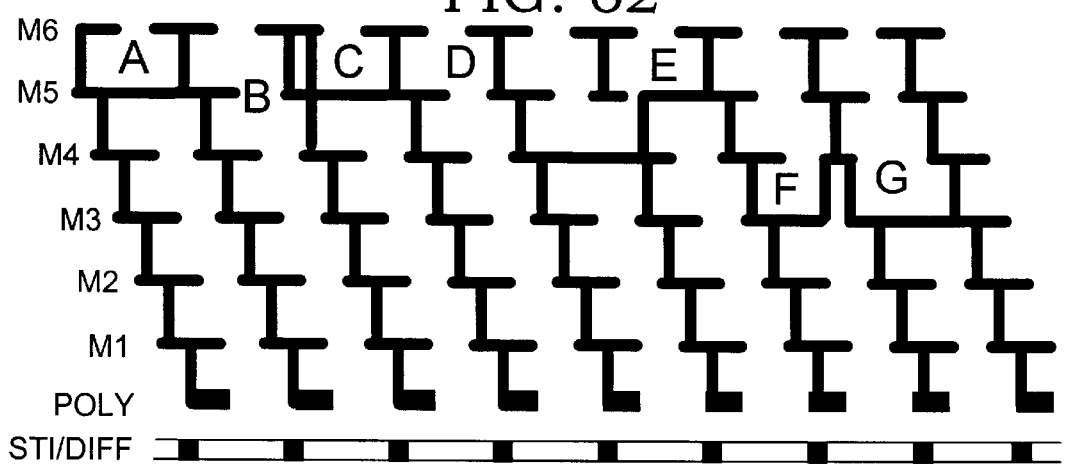

Referring, now to FIG. 62, additional examples of variations in implementing the invention are shown. In the area labeled "A" a light pocket is formed which controls the reflective characteristics of the region of the image under which the light pocket is formed. In region "B" the light entering is reflected into the underlying structure. Region "C" is another type of light pocket.

Region "D" shows a type of pocket in which only a portion of the light entering the pocket is permitted to escape into the device. Region "E" is another way in which to allow light entering in one pixel to modify the characteristics of an adjacent pixel. Regions "F" and "G" show other forms of light pockets.

Thus, the interaction between multiple reflective/absorbing material levels can be used in combination to provide desired optical effects.

Contrast Improvements

In general there is an interest in techniques which will improve the contrast available to images formed by the subject printing technique. There are several techniques immediately available to increase the contrast. Generally, it is desirable to minimize the reflection from the frame wire, to maximize reflection from the portion of the wire which represents the change in reflectivity for the pixel-and to minimize all other incidental reflections.

Figure 63:
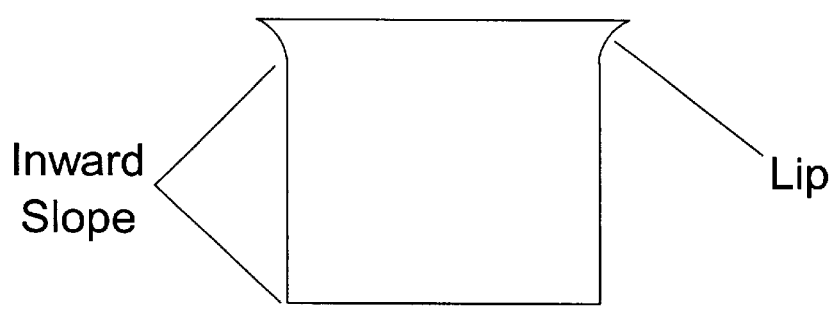
FIG. 63 shows the cross section of a single Damascened copper wire line showing the slight flair at the upper planarized portion of the line.

First, the cross section of the wires resulting from the damascene process preferred in forming the images, As shown in FIG. 63, one can see two features which increase contrast when looking directly down upon the image. First, because of the polarity of the resist and image exposure the Damascened wires taper inward slightly from top to bottom. This taper has the effect of causing the noisy, unpolished edges of these wires to always in the shadow of the top surface.

The second feature, also seen in FIG. 63, is that there is a flare or umbrella on the top of the wire which comes from polishing the top of the wire in the damascene process. This "lip" also assists contrast and increases the positive viewing angle in that it hides or masks the noisy sides of the wire.

Other ways to modify the reflective characteristics of metal lines is to thin the insulating material over the mirrored surface.

Or one can increase the thickness of the insulator below the mirrored surfaces so light which reflects below will have less energy.

Adding non reflective material or damaging the mirrored surface of the polished metal via ion implantation or other means in the regions representing the frame wire can be used to make the frame wire less prominent.

Non reflective materials can be used in the channels between mirrors as can mirrors made out of the silicon surface itself which reflect so as to scatter the light which hits it.

Adding layers of material with a lower index of refraction which will tend to deflect light not perfectly perpendicular to the surface onto the top and bottom edges of the reflective shapes can also be implemented so that reflected light does not return to the surface. The interface between insulators can be made with varying indexes of refraction can be roughened or made lumpy so they scatter light which passes through.

It will be obvious to those skilled in the art, that other methods of manipulating the optical characteristics can be applied to the instant technique of printing.

Verifying Image Quality

It is obvious that if one intends to produce tens of thousands of images a need exists for something other than eyeball inspection. Given the very tight controls in semiconductor manufacturing processes for most applications, a sampling of some small number of image locations for visual inspection and the verification of these images would insure that the other images are acceptable, so long as small random defects are tolerable.

For applications where a much higher image quality is required, it is preferred that the following testing methods be used.

The first is simply to measure the average intensity of the image or of subsections of the image. The amount of light which should be reflected from a particular image can be calculated knowing the properties of the materials involved and knowing how the image was constructed. One would compare this calculated intensity to one actually measured. Significant differences would indicate problems or defects in the image on the semiconductor. The image window size will be determined by many factors including manufacturing tolerances, measurement accuracy, measurement tolerance and the defect sizes we wish to find.

Figure 64A:
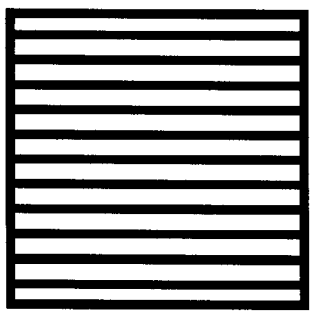
FIGS. 64a, 64b and 64c show the different effect on reflectivity caused by defects on a portion of an image.
Figure 64B:
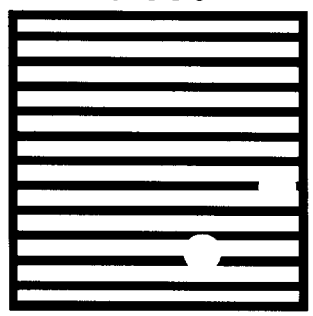
Figure 64C:
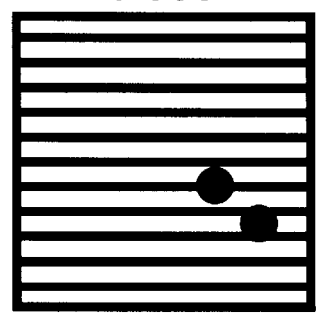

FIG. 64a, is a subwindow on a larger image and 0.342 is the expected reflectivity if correctly manufactured. In FIG. 64b two random defects have added material to the image in the subwindow and the reflectivity has increased to 0.359. In FIG. 64c two non-reflective defects have caused material to be removed from the subwindow and the reflectivity drops to 0.333. The difference in expected reflectivity for the images in FIG. 64b and FIG. 64c indicates a problem exists in this subwindow.

If multiples of the same image are present on a semiconductor wafer the reflected intensity from like areas can be compared with each other or with a standard. Again if particular images are defective they are likely to fall outside this standard. The only problem case being that in which defects exist which both add and subtract material so that the overall reflectivity is compensated or balanced. Such an occurrence would be rare, but possible.

Alignment structures will be needed to align accurately to the image before any of these comparisons can be made. It is preferred that alignment aids, as have been commonly used in semiconductor processing for years, be used.

For more detailed checking electrical tests can be used. These can be done with or without the use of active devices. In the simplest implementation we will look for shorts between interleaved frame wires. A short between the two test pads in the schematic figure below would indicate we have extra material, but it would miss the fact we have an open and it does not indicate the location of the extra material.

Figure 65:
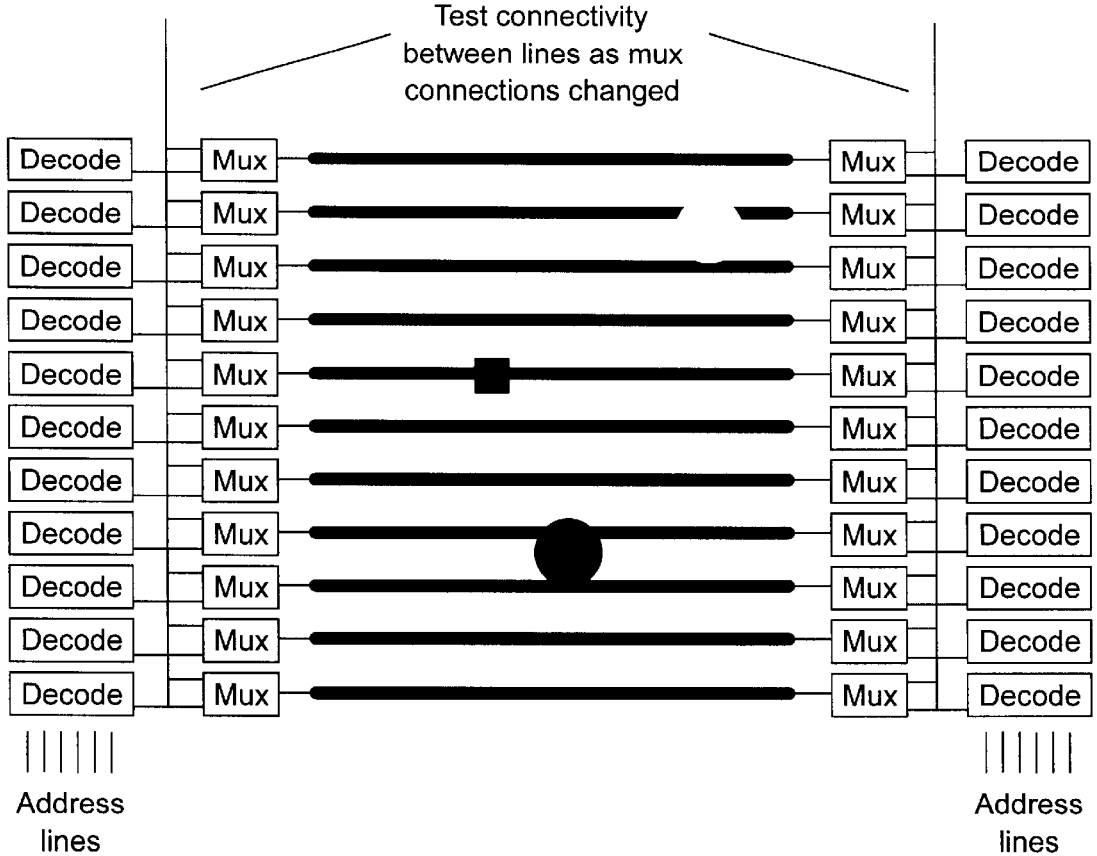
FIG. 65 shows a plan view of a test structure useful in detecting defects in frame wire images.

By adding active support circuits, a extremely effective job of testing can be accomplished. FIG. 65 shows a layout including a central array of frame wires supporting an image and includes support circuits of addressable multiplexors or pass gates. The pass gates are controlled by decoders which will activate various combinations of frame wires and look for both extra material (shorts) and missing material (opens). Further this method lets one localize the defects in the image.

A combination of image verification methods can also be used and these methods can be applied to single and multiple level images.

Applications

While many applications of the instant imaging/printing technique will be apparent to those skilled in the art, the following specific applications become simple to implement.

Image Archive

Although the images formed by the inventive technique provide a digital representation of an object, once written in a semiconductor device, these images are in analog form. For example, images appear as any photographic image and one only requires a magnification means to visually perceive them. Microscopes are cheep and easy to obtain and are sure to out last the special digital reading formats and readers currently known to be used with digital imaging systems.

One useful application is that of microfilm replacement for archival purposes. While the very highest quality of microfilm has a resolution of about 25,000 dots per inch (dpi), the instant technique can easily achieve more than 50,000 dpi. Thus, an entire 200 mm semiconductor wafer can be filled with microimages much as semiconductor devices are today. A simple or automated system can be used to access individual frames of information. Mass production of such archive media is trivial.

Multiple Images

Figure 66:
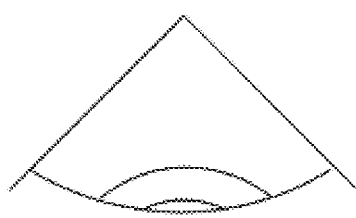
FIG. 66 shows a schematic representation of an observation technique which allows two images to be formed in the same surface area of a semiconductor device.
Figure 66:
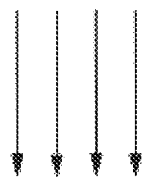
Figure 66:
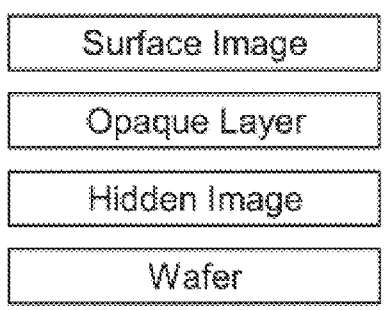

Because the images produced by the instant invention are inherently formed in any one or more levels of metal, multilevel printing techniques can be utilized to produce interesting effects. First, because silicon is transparent to certain frequencies of light in the infrared region, a secondary image can be created which faces toward the silicon. This image can only be seen from the back side of the semiconductor device with infrared illumination and a ccd camera. This feature can be used as a security feature or "water mark" for products in which the front side contains the primary images. FIG. 66 is a schematic view demonstrating this embodiment. For best viewing, an opaque layer can be inserted between the images.

Other multiple image techniques can take advantage of the transparency of thin metal films to certain frequencies of light. The most commonly used commercially is the multilayer DVD fonnat which stores one set of bits below the top one. We envision encoding different images below the top one which would be viewed in total—a way to see analog information below the top surface.

Figure 67:
FIG. 67 shows a schematic representation of a technique for providing color images using filters in combination with the frame wire image technique of the invention.
Figure 67:
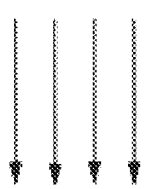
Figure 67:
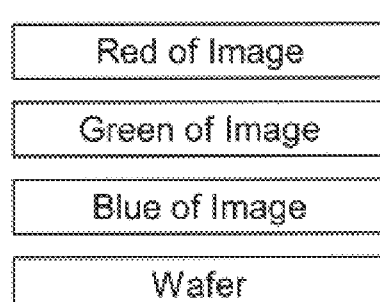

One application might be to add color to our images in this way as shown in FIG. 67 which shows the three primary colors as separate layers within a single region of a device. Colored layers can be utilized either as a composite color image or as selectively perceived separate images, as different layers of a color separation.

Direct Color Images

Figure 68:
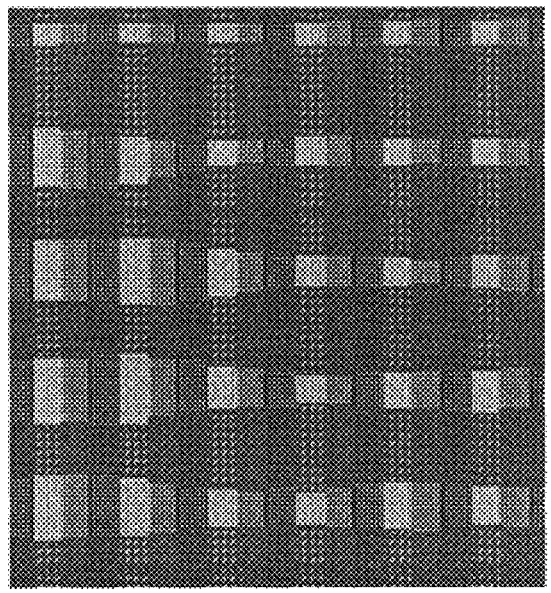
FIG. 68 illustrates a composite technique for generating color images.

The basic frame wire pixel technique used for gray scale images may also be used to create composite color images much as a color television tube generates color images. Because of the lateral compression inherently available in the subject invention, separate pixels for each of red, green and blue can be implemented as the standard background. Dark imaging can then be provided over this background leaving all or portions of the respective colors exposed, as illustrated in FIG. 68. The gray scale feature of the invention allows for a gray scale intensity of color to be provided.

Bar Codes and Other Indicia

To help with semiconductor product tracking the inventive technique can be used to create bar code labels which could be read on the chips surface and which would help with product tracking and control.

Figure 69:
FIG. 69 illustrates the use of the invention to generate bar codes.
Figure 69:
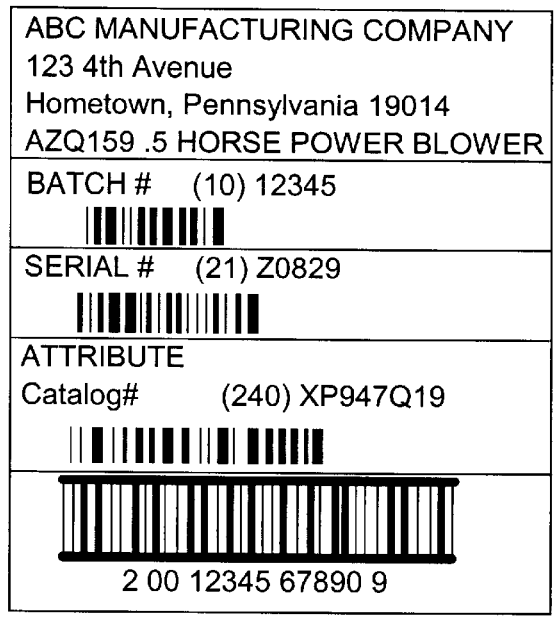

Images, such as shown in FIG. 69, cannot be physically implemented legally in current semiconductor manufacturing processes, yet by using the frame wire technique of the invention are trivial to implement.

Such images incorporate various line widths and spaces which are a problem and further include extensive white space—also a problem. Further, to create the images from polygons directly is problematic.

These product bar codes could be placed throughout the chip where we might otherwise have metal fill shapes. And they can appear on more than one masking layer. They would even appear on the mask although complement images might be needed to provide the correct image.

Displaying Images

It is also possible to create more integrated indicator lights with this technique. In cars for example there is often a light or LED behind some mask which forms an image that tells you to service your engine or that your oil is too low.

In this embodiment, the original image—the compliment of what is to be displayed—is placed over a light source on a semiconductor.

Figure 70:
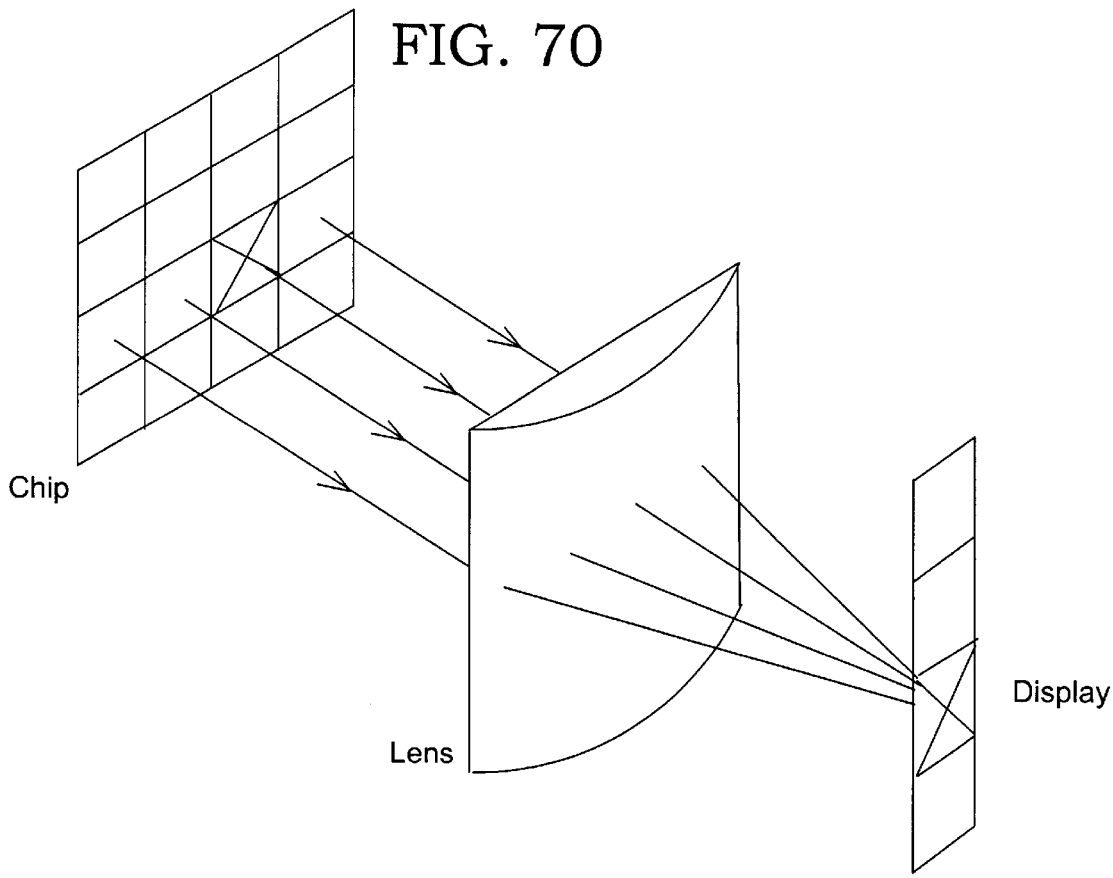
FIG. 70 is a generalization showing how images on a semiconductor chip may be used to generate projected images.

Each chip could contain many images. Enough images, for example to provide a plurality of separate indicators in different languages. By selectively manipulating the light source, different images can be displayed, as illustrated in FIG. 70. By manipulating light sources, animation or variations in an image can be portrayed.

Direct Write for Customization

While many applications of the invention can use the entire metallurgical interconnect structure comprising many levels of frame wires, some applications will require more individualized customization. For example, a wafer might be processed to the upper levels of metallurgy and have the rinal level customized to provide unique identification.

This process would be followed with a direct write system—ideally in some integrated tool—to add personalization—serial numbers etc. This capability to customize in line as a standard offering would be very powerful for chip designers. In SRAM design, for example, tens of part numbers are offered by making a very small number of modifications to one level in the design. This is currently accomplished by generating custom masks for each part number. On each of these masks you will find that 99.99% of the shapes forming a mask level are identical. Generating new masks to add 50 shapes is highly inefficient. Embodied in the subject invention is the ability to provide the 50 shapes without a mask.

For applications like putting a credit card users image on the security chip in the card will require direct write capabilities at the wafer level. These systems certainly exist, but have seldom been used for production because of through put limitations. Tools like e-beam might be especially attractive because they would allow us to shrink the width of the frame wires and L-hereby increase contrast and image resolution.

While the invention has been described in terms of semiconductor devices, the technique can be used, for example, on quartz wafers.

Further Variations

If by processing, frame wires cannot be eliminated, they can be allowed to "drift" from one frame to the next.

Additional brightness can be achieved by adding white frames to images.

Multiple channels should be physically connected and run on one stepper to eliminate alignment problems.

Multiple Images From a Single Array

Figure 71:
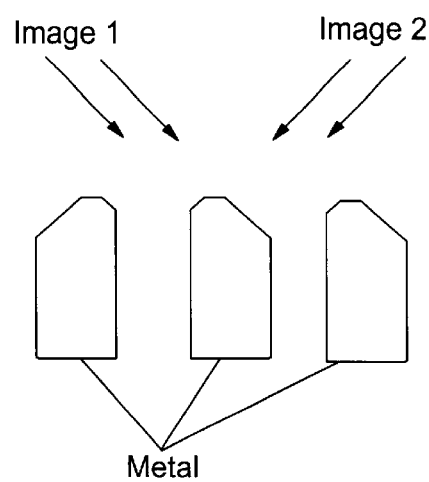
FIG. 71 is a schematic representation of a technique for generating two images within the same physical space by causing different reflective characteristics for Darnascened lines.

Two separate image planes can be created by using two different directional etch steps which alter the top surface of lines as shown in FIG. 71, such that a different image is perceived depending upon the viewing angle.

Figure 72:
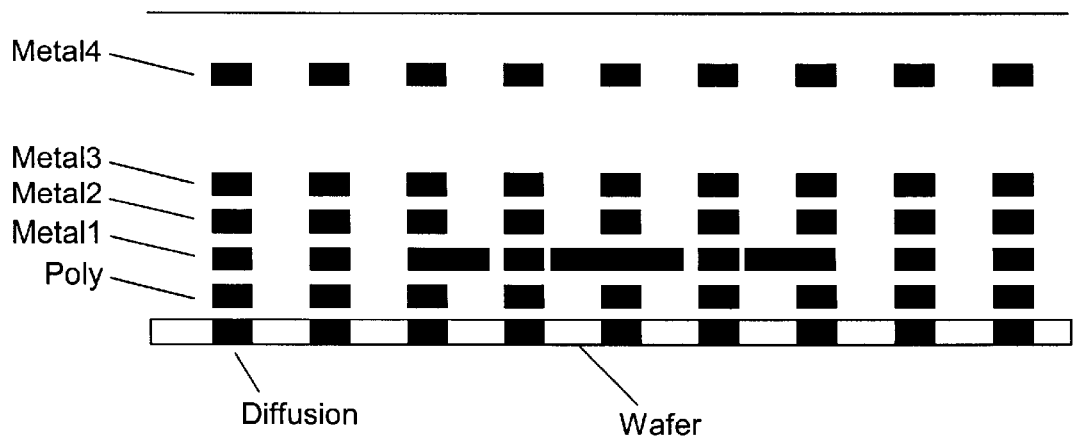
FIG. 72 is a cross section of a semiconductor device in which a level other than the top level of interconnect is used to form an image.

And, finally, it will be seen that image patterned levels need not be limited to the top level. As shown in FIG. 72, a subsurface level is customized, while the remainder of the device metallization is unchanged.

While the invention has been described in terms of limited embodiments, it will be understood by those skilled in the art that various changes in detail can be made within the spirit of the invention. For example other semiconductor metallurgy processes can be substituted for that described herein.

What is claimed is:

1. A gray scale image representing a graphic image including two or more levels of indicia having a plurality of image segments and having a continuous line formed in the surface of a substrate, wherein each image segment includes a portion of said continuous line and a contrasting material providing a pixel in which the width of the line within a segment varies in relationship to gray scale levels in said graphic image.

2. The gray scale image of claim 1 wherein the continuous line is a conductor.

3. The gray scale image of claim 2 wherein the surface of the substrate comprises an insulator.

4. The gray scale image of claim 1 wherein the image is formed from a plurality of pixels, each pixel comprising a frame wire, the width of which varies from a fixed minimum to a width filling the entire pixel.

5. The gray scale image of claim 4 wherein there is provided a plurality of pairs of frame wires, each pair being a complementary unit symmetrical about a common axis.

6. The gray scale image of claim 1 wherein said continuous line comprises a minimum width line formed in a semiconductor technology.

7. The gray scale image of claim 1 further comprising complementary pairs of said image segments separated by a minimum space dimension.

8. The gray scale image of claim 1 wherein said image is comprised of a plurality of levels of conductor.

9. The gray scale image of claim 1 wherein said image segments having length to width dimensions having a ratio other than 1:1.

10. The gray scale image of claim 9 wherein said ratio is about 3:1.

11. A substrate comprising a plurality of gray scale images representing graphic images, each image including two or more levels of indicia having a plurality of image segments and having a continuous line formed in the surface of a substrate, wherein each image segment includes a portion of said continuous line and a contrasting material providing a pixel in which the width of the line within a segment varies in relationship to gray scale levels in said graphic image.

12. The substrate of claim 11 further comprising an index to said plurality of images, said index allowing accessing of selected images.

13. The gray scale image of claim 11 wherein said continuous line is formed of a metal conductor formed on a semiconductor substrate.

14. The gray scale image of claim 13 wherein said metal conductor is a Damascened copper line.

15. The gray scale image of claim 14 wherein said Damascened copper line includes a via portion and a trough portion.

16. The substrate of claim 11 further including at least one image superimposed on another.

17. The substrate of claim 16 wherein said images are separated from each other by an opaque layer.

18. The substrate of claim 16 wherein there is further provided color information to provide color images.

19. The substrate of claim 16 further comprising image segments for determining relative reflectivity between similar images.

20. The substrate of claim 16 further comprising a plurality of multiplexing and decoding circuits for accessing individual lines of said segments.

21. The method of forming a physical replica of a gray level, two dimensional image comprising the steps of:

providing a graphic image to be converted;

converting said graphic image to a gray level, two dimensional bit mapped image;

converting said bit mapped image into a set of parallel lines of varying width; each line comprising a single continuous segment in which the width varies based on the density of the gray level required to form said gray level image; and transferring said set of lines to a pattern of conductor/insulator lines on a substrate.

22. The method of claim 21 wherein the substrate comprises a semiconductor.

23. The method of claim 21 wherein the continuous segment comprises a conductor or an insulator.

24. The method of claim 23, wherein the step of converting the image includes the step of coplanarizing a conductor and an insulator.

25. The method of claim 24 wherein coplanarization is implemented by Chemical Mechanical Planarization.

* * * * *